(12) United States Patent
Yoshida et al.

(10) Patent No.: US 7,830,035 B2
(45) Date of Patent: Nov. 9, 2010

(54) POWER SUPPLY UNIT

(75) Inventors: Koji Yoshida, Nara (JP); Hiroyuki Handa, Osaka (JP); Mitsuhiro Matsuo, Osaka (JP); Masafumi Nakamura, Mie (JP); Takaharu Murakami, Osaka (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 12/307,994

(22) PCT Filed: Jun. 18, 2007

(86) PCT No.: PCT/JP2007/062217

§ 371 (c)(1),
(2), (4) Date: Jan. 8, 2009

(87) PCT Pub. No.: WO2008/007519

PCT Pub. Date: Jan. 17, 2008

(65) Prior Publication Data
US 2009/0315401 A1   Dec. 24, 2009

(30) Foreign Application Priority Data

Jul. 10, 2006  (JP) .............................. 2006-188879
Nov. 28, 2006  (JP) .............................. 2006-319850

(51) Int. Cl.
*H02J 1/10*  (2006.01)
(52) U.S. Cl. .............................. 307/18; 307/19; 307/28; 307/9.1

(58) Field of Classification Search .................. 307/18, 307/19, 28, 9.1
See application file for complete search history.

(56) References Cited

FOREIGN PATENT DOCUMENTS

| JP | 4-251522 A | 9/1992 |
|---|---|---|
| JP | 2004-328950 A | 11/2004 |
| JP | 2005-112250 A | 4/2005 |
| JP | 2005-204391 A | 7/2005 |
| JP | 2005-237149 A | 9/2005 |

OTHER PUBLICATIONS

International Search Report for PCT/JP2007/062217, Jul. 31, 2007.

*Primary Examiner*—Robert L. Deberadinis
(74) *Attorney, Agent, or Firm*—RatnerPrestia

(57) ABSTRACT

The power supply unit has a sample-and-hold circuit that samples a voltage supplied from a power source to a load according to a sample timing signal and holds the voltage as an output set value for the DC/DC converter. The unit supplies a load with an output from the DC/DC converter controlled so that an output voltage of a power source becomes an output set value of the DC/DC converter when the voltage of the power source drops. Since a voltage corresponding to the voltage of the power source before the voltage drop is set to the output set value of the DC/DC converter, a stable power supply unit is obtained in which the difference is always small between the voltage of the power source in normal times and the output voltage from the DC/DC converter when the voltage of the power source temporarily fluctuates.

12 Claims, 22 Drawing Sheets

POWER SUPPLY UNIT

This application is a U.S. National Phase Application of PCT International Application PCT/JP2007/062217.

TECHNICAL FIELD

The present invention relates to a power supply unit compensating voltage fluctuation of a power source.

BACKGROUND ART

In recent years, to protect the earth environment from the aspect of improving fuel efficiency especially in automobiles, technologies have been developed such as stop idling, electromotive power steering, electromotive turbocharger, and brake regeneration. Among these technologies, stop idling, electromotive power steering, and electromotive turbocharger, for example, consume a large amount of current on the order of 100 amperes to activate a starter, steering motor, and turbine drive motor, respectively, thus causing a voltage drop in a power source composed of such as a battery and power generator. A large voltage drop prevents a load powered from the power source from operating satisfactorily. Performing brake regeneration generates a regenerative current on the order of a maximum of 100 amperes, depending on the vehicle speed, thereby increasing the voltage of the power source. Directly supplying such voltage causes supply voltage to the load to increase, possibly preventing normal operation.

As a method of eliminating such influence of temporary voltage fluctuation of a power source, the following measure is proposed against a voltage drop, for example, in Patent Document 1. That is, a voltage drop protection circuit is provided between the battery and auxiliaries. The voltage drop protection circuit may use either of the following method. That is, one includes a capacitor as an auxiliary power supply as described in Patent Document 1, and the voltage is compensated by supplying auxiliaries with power from the capacitor when the battery voltage drops. The other does not include an auxiliary power supply, but the voltage is compensated by raising the voltage of the battery to supply to auxiliaries when the battery voltage drops.

In either of the methods, the voltage drop protection circuit requires a DC/DC converter that converts voltage of a capacitor and/or battery to that required for operation of auxiliaries. Here, a description is made for a concrete example of a voltage drop protection circuit including a capacitor as an auxiliary power supply, using FIG. 22.

In FIG. 22, voltage drop protection circuit 1 includes a DC/DC converter circuit configuration, where its input is connected to the output through coil 2 and diode 3. The connecting point of the cathode of diode 3 with the output is connected to the ground through capacitor 4. Further, the connecting points of coil 2 with diode 3 are connected to the ground through transistor 5, and the base of transistor 5 is connected to the output from controller 6. Controller 6 monitors output voltage of voltage drop protection circuit 1 to on-off control transistor 5. Operation of controller 6 is controlled according to an on-off signal from the outside.

In such voltage drop protection circuit 1, transistor 5 is on-off controlled by controller 6 operating according to an operation on-off signal and charges capacitor 4 with voltage increased by means of coil 2. Additionally, controller 6 monitors output voltage of voltage drop protection circuit 1 to maintain the voltage at a predetermined output set value. Consequently, even in a low-voltage state of the battery, the output voltage of voltage drop protection circuit 1 can be controlled so as not to decrease. The above is an example of a power supply unit compensating a voltage drop of a power source.

The example in Patent Document 1 compensates a voltage drop of a battery. Meanwhile, output voltage of voltage drop protection circuit 1 may be suppressed by storing power in brake regeneration to capacitor 4, for example.

It is true that such a conventional power supply unit can supply a load with stable voltage even if voltage of a power source fluctuates. However, the problem lies in the fact that the voltage output set value of controller 6 is constant. That is, a battery or the like as a power source produces voltage fluctuation relatively small (concretely, a range between approximately 12 V and 14 V) over a long duration according to an environment change such as fluctuation in ambient temperature and/or deterioration. For this reason, the output set value of controller 6 is fixed to a value (e.g. 11 V) lower than the lowest value (12 V) in a long-term voltage fluctuation range of the battery in order to output power from the battery preferentially in normal times, during which a temporary voltage fluctuation of the battery does not occur. With this arrangement, when the normal battery voltage is approximately 12 V (i.e. lowest value), power is supplied to the load with the output voltage from capacitor 4 controlled to be 11 V if the battery voltage temporarily decreases due to such as driving the starter. Accordingly, the load can be kept driven without problems because the supply voltage decreases from 12 V to 11 V at lowest from the viewpoint of the load. If the regular battery voltage is 14 V, however, the voltage results in suddenly decreasing from 14 V to 11 V (the gap is as high as 3 V) from the viewpoint of the load because voltage drop protection circuit 1 outputs a constant voltage of 11 V due to a temporary drop of the battery voltage. This can possibly affect operation depending on a load.

When performing regeneration by braking, the voltage of the power source temporarily increases as well, and thus controller 6 operates so as to charge capacitor 4 when a certain predetermined voltage (e.g. 14.5 V) is exceeded. At this moment, if the voltage of such as a battery before regeneration is 14 V, the voltage fluctuation is small, however if the battery voltage is 12 V, the supply voltage to the load suddenly increases to 14.5 V, which can possibly affect the load in the same way as the above.

Patent Document 1: Japanese Patent Unexamined Publication No. 2005-112250

SUMMARY OF THE INVENTION

To address the above problems, the present invention provides a power supply unit in which the difference is always small between the voltage of a power source in normal times and the output voltage of a DC/DC converter when the voltage of the power source fluctuates.

A power supply unit of the present invention includes a sample-and-hold circuit that samples voltage corresponding to the voltage supplied from a power source to a load according to sample timing signal 27 and holds the voltage as an output set value of the DC/DC converter. When the voltage of the power source fluctuates, the power supply unit controls the output voltage of the DC/DC converter so as to be the output set value. By supplying the load with power with the output voltage controlled as explained above, the power supply unit can follow long-term voltage fluctuation of the power source. This structure enables voltage before the voltage of the power source temporarily fluctuates to be an output set value.

With a power supply unit of the present invention, the output set value of a DC/DC converter is updated to a value corresponding to the voltage of the power source immediately before voltage fluctuation, and thus even if the voltage of the power source in normal times fluctuates due to environmental influence, the output voltage of the DC/DC converter is controlled according to the fluctuation. This enables the difference is always small between the voltage of a power source in normal times and the output voltage of a DC/DC converter when the voltage of the power source fluctuates, thereby keeping the load stably operated.

DETAILED DESCRIPTION OF PREFERRED EMBODIMENTS

Hereinafter, a description is made for some preferred embodiments with reference to the related drawings.

First Exemplary Embodiment

Figure 1:
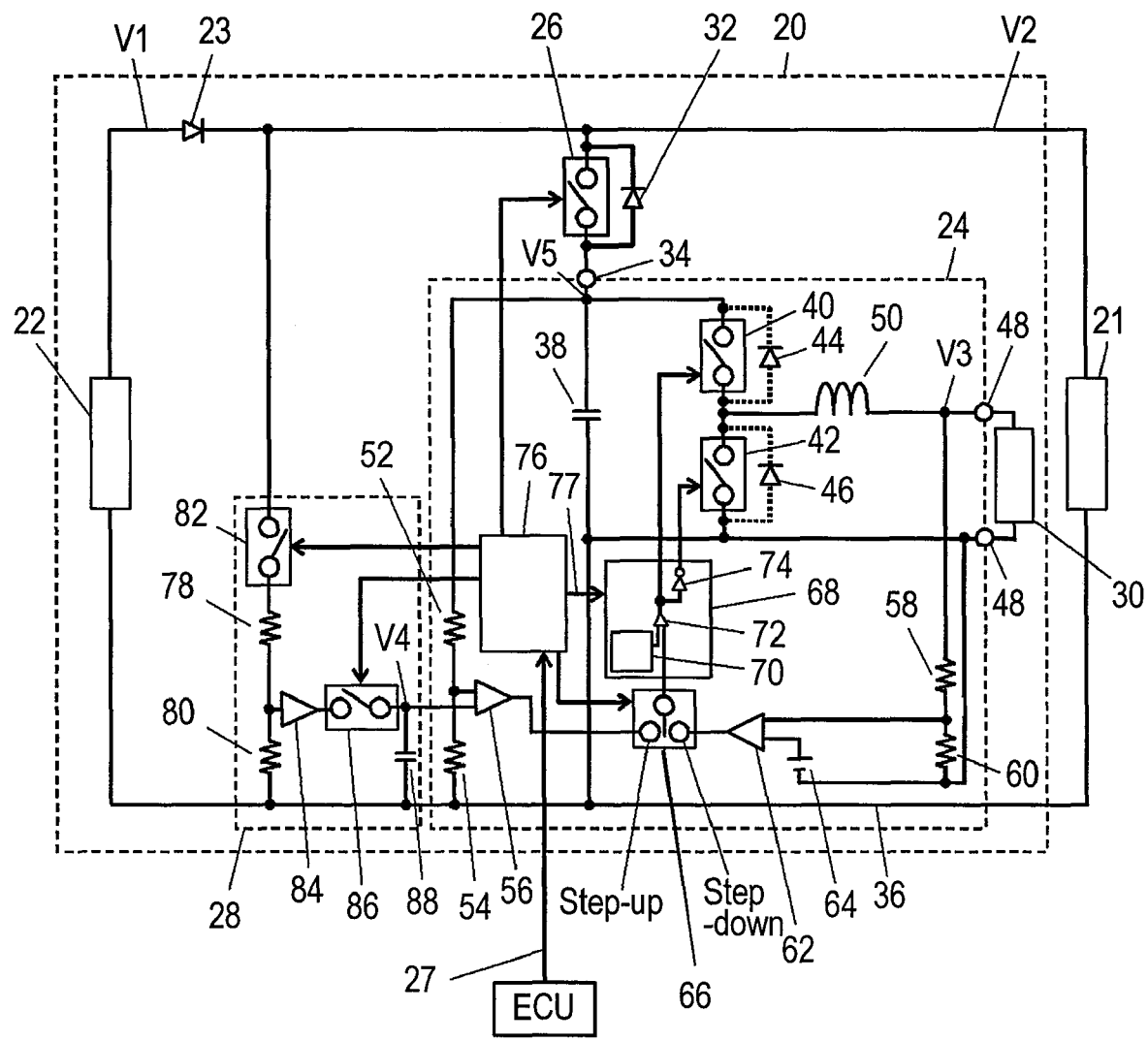
FIG. 1 is a block circuit diagram of a power supply unit according to the first embodiment of the present invention.
Figure 2:
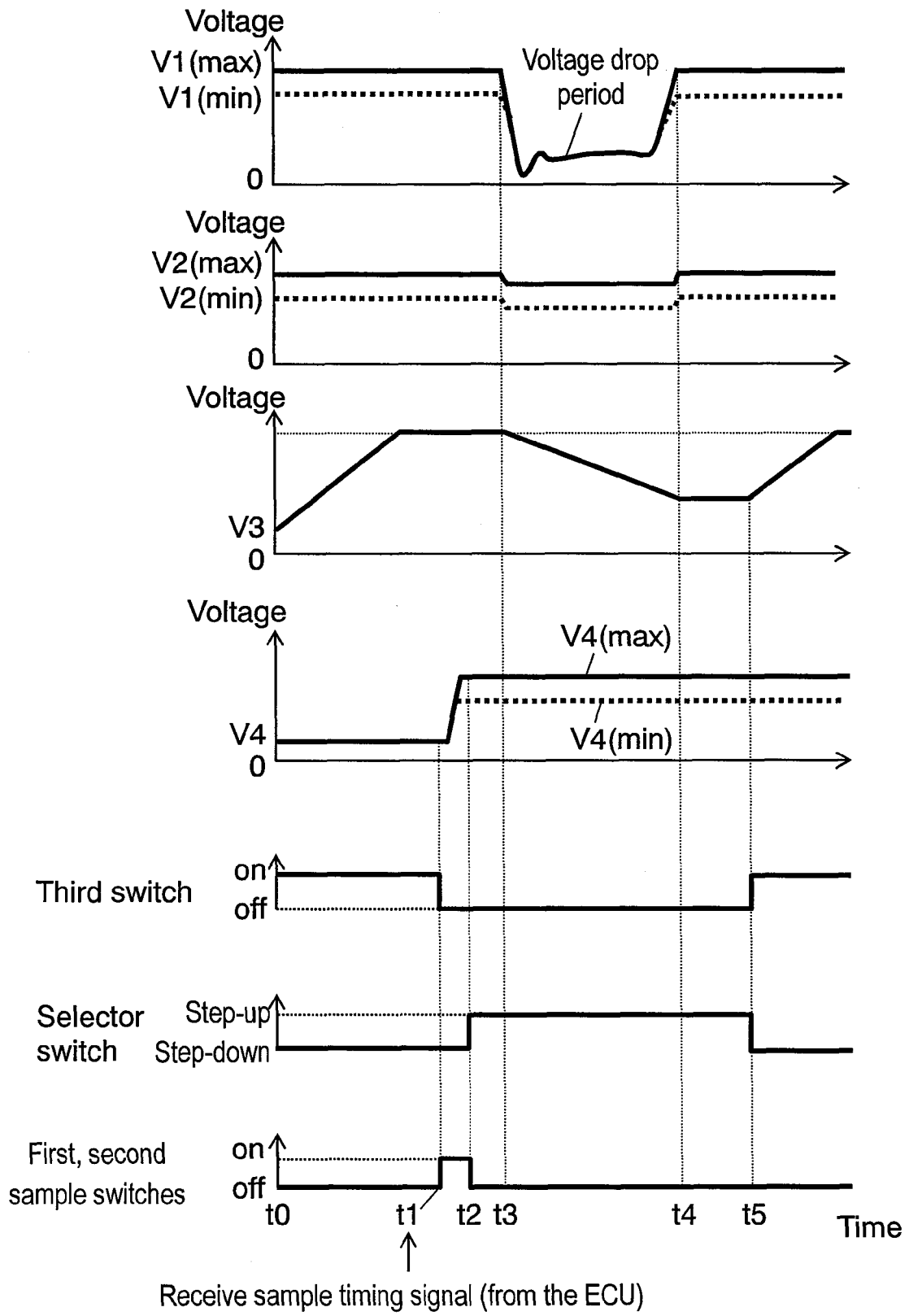
FIG. 2 is a timing diagram showing the operation of the power supply unit according to the first embodiment of the present invention.
Figure 3:
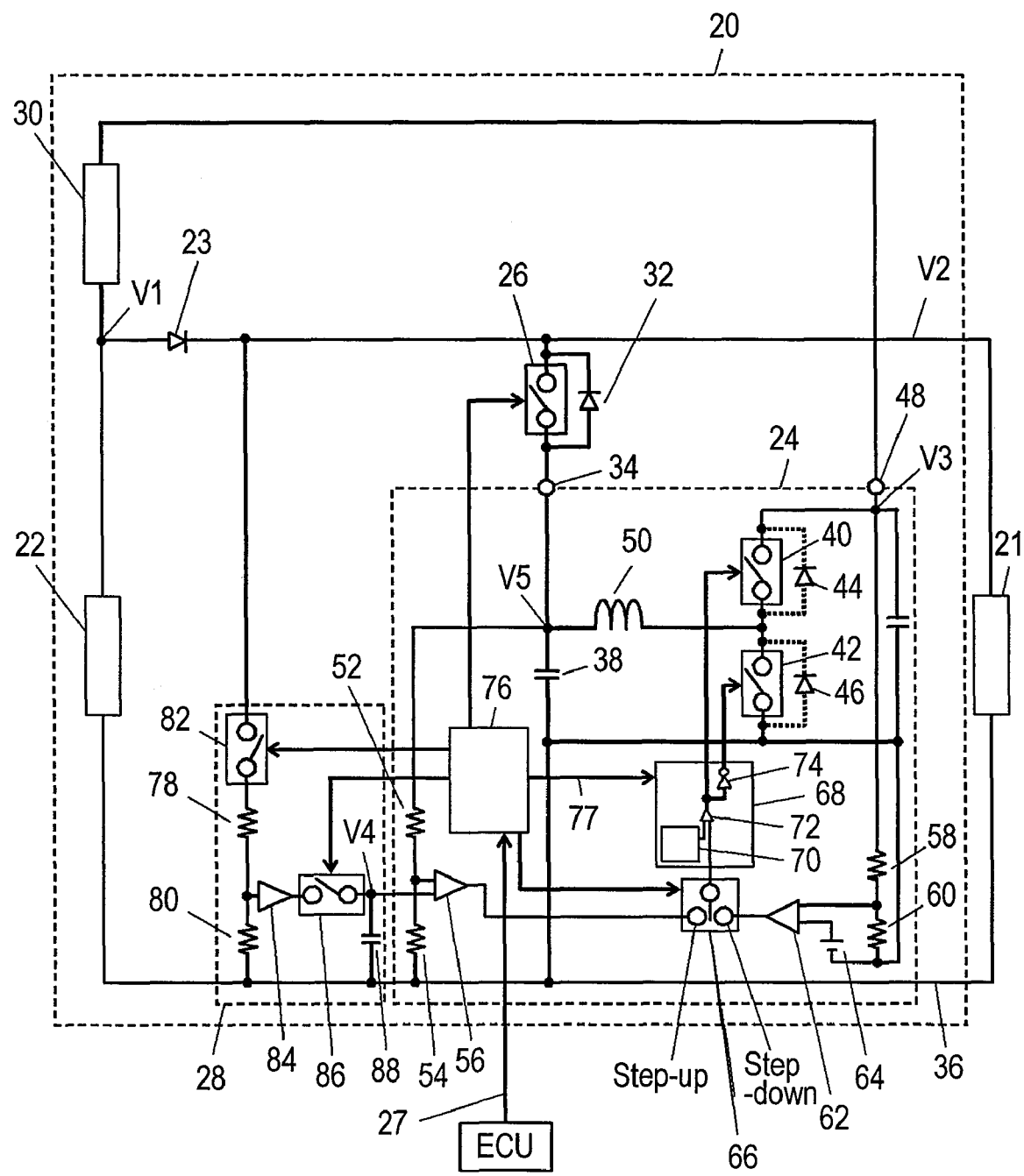
FIG. 3 is a block circuit diagram of a power supply unit with another structure, according to the first embodiment of the present invention.

FIG. 1 is a block circuit diagram of a power supply unit according to the first embodiment of the present invention. FIG. 2 is a timing diagram showing the operation of the power supply unit according to the first embodiment of the present invention. FIG. 2 includes time-lapse change of voltage V1 of power source 22, time-lapse change of voltage V2 supplied to load 21, time-lapse change of voltage V3 of auxiliary power supply 30, time-lapse change of voltage V4 of capacitor 88 for sample and hold, an on-off timing diagram of third switch 26, a switching timing diagram of selector switch 66, and an on-off timing diagram of first and second sample switches 82, 86. FIG. 3 is a block circuit diagram of a power supply unit with another structure, according to the first embodiment of the present invention.

In the first embodiment, a description is made for the structure in which, when voltage of the power source drops due to such as driving a starter, power of the auxiliary power supply is voltage-converted by a DC/DC converter, and DC output is supplied to the load.

In FIG. 1, power supply unit 20 supplies load 21 with power, where they are electrically connected to each other. Power supply unit 20 comprises power source 22 including a battery and generator, selection switch 23, DC/DC converter 24, third switch 26, sample-and-hold circuit 28, and auxiliary power supply 30 including a capacitor capable of charging and discharging.

Here, selection switch 23 switches between output from power source 22 and output from DC/DC converter 24 as a power source supplying load 21 with power. Concretely, selection switch 23 is composed of a diode to automatically change so as to supply load 21 with power from auxiliary power supply 30 when voltage V1 of power source 22 drops. This prevents a current output from auxiliary power supply 30 through DC/DC converter 24 from flowing back to power source 22 when voltage V1 temporarily drops.

DC/DC converter 24 is a bidirectional converter capable of charging and discharging auxiliary power supply 30 with a single circuit. Further, third switch 26 has rectifier element 32 in parallel therewith and can be on-off controlled externally, and an FET is used as third switch in the first embodiment. In this case, rectifier element 32 works as a body diode of the FET. Here, a capacitor used for auxiliary power supply 30 is an electric double-layer capacitor that has excellent rapid charge-discharge characteristic and large capacity. With these structure, DC/DC converter 24 obtains output voltage from power source 22 or auxiliary power supply 30.

One end of third switch 26 is connected to first Input/Output (I/O) terminal 34 of DC/DC converter 24, and the other end is connected to the connecting point of selection switch 23 and load 21. Consequently, power source 22 is connected to DC/DC converter 24 through third switch 26. Here, rectifier element 32 is connected so that first I/O terminal 34 side is an anode.

Next, a description is made for the detailed structure of DC/DC converter 24. First, first I/O terminal 34 has smoothing capacitor 38 connected thereto between terminal 34 and ground 36 for smoothing output in step-up operation. Here, the capacitance of the electric double-layer capacitor of auxiliary power supply 30 is larger than a capacitance of smoothing capacitor 38.

Both ends of smoothing capacitor 38 have two switches (first switch 40, second switch 42) series-connected thereto. Here, first switch 40 and second switch 42 can be externally controlled so as to alternately repeat on-off operation. FETs are used as first and second switches 40, 42 in the first embodiment, as well as third switch 26. Therefore, body diodes 44, 46 are formed as shown by the broken lines in the wiring of FIG. 1. First switch 40 is connected to a positive electrode side of smoothing capacitor 38 so that voltage between the positive and negative electrodes of second I/O terminal 48 of DC/DC converter 24 becomes higher as on-time of first switch 40 becomes longer.

The connecting point of first switch 40 with second switch 42 is connected to one end of coil 50 (i.e. inductance element). The other end of coil 50 is connected to the positive electrode of second I/O terminal 48 giving and receiving power to and from auxiliary power supply 30. Here, a smoothing capacitor for smoothing output is not provided in the first embodiment, however it may be provided between the positive and negative electrodes of second I/O terminal 48.

To detect voltage V5 at first I/O terminal 34, two resistors 52, 54 for detecting voltage V5 are series-connected between first I/O terminal 34 and ground 36. With these resistors, voltage at the connecting point of resistors 52, 54 for detecting voltage V5 is detected as voltage proportional to voltage V5. Therefore, by connecting the connecting point to one input terminal of first error amplifier 56 and connecting an output set value determined by sample-and-hold circuit 28 to the other input terminal, first error amplifier 56 outputs an error between them to make voltage V5 equivalent to the output set value when auxiliary power supply 30 discharges (i.e. in step-up operation of DC/DC converter 24 in the first embodiment). The detailed structure of sample-and-hold circuit 28 is described later.

In the same way, to detect voltage V3 at the positive electrode of second I/O terminal 48, two resistors 58, 60 for detecting voltage V3 are series-connected between the positive electrode of second I/O terminal 48 and the negative electrode of auxiliary power supply 30. With these resistors, the voltage at the connecting point of resistors 58, 60 for detecting voltage V3 is detected as voltage proportional to voltage V3. Therefore, by connecting the connecting point to one input terminal of second error amplifier 62 and connecting set voltage source 64 to the other input terminal, second error amplifier 62 outputs an error between them to make voltage V3 corresponding to the output set value when charging auxiliary power supply 30 (i.e. in step-down operation of DC/DC converter 24 in the first embodiment).

The output terminal of first error amplifier 56 and that of second error amplifier 62 are connected to selector switch 66 for selecting either one of them. This selector switch 66 switches between step-up and step-down operation. That is, when selector switch 66 selects the output of first error amplifier 56, step-up operation from auxiliary power supply 30 to load 21 is to be performed; when selector switch 66 selects the output from second error amplifier 62, step-down operation from power source 22 to auxiliary power supply 30 is to be performed.

Output selected by selector switch 66 is input to switching signal generation circuit 68. Switching signal generation circuit 68 compares a signal having been input with output from oscillation circuit 70 using comparator 72, generates a pulse signal for turning on and off first switch 40 and second switch 42, divides an input into two, and inputs one of them to inverting circuit 74 to generate on and off signals mutually inverted. These signals are separately input to first switch 40 and second switch 42 to perform voltage conversion (i.e. step-up and step-down of DC/DC converter 24). Here, switching control of selector switch 66, operation control of switching signal generation circuit 68, on-off control of third switch 26, and operation control of sample-and-hold circuit 28 are performed by control circuit 76. Of these, the operation of switching signal generation circuit 68 is controlled by receiving switching start-up signal 77 from control circuit 76.

Next, a description is made for the detailed structure of sample-and-hold circuit 28. Sample-and-hold circuit 28 has a function to sample voltage corresponding to voltage V2 currently supplied from power source 22 to load 21 according to sample timing signal 27 delivered from an external unit, e.g. from an engine ECU, and to hold it as an output set value of DC/DC converter 24.

First, to sample voltage V2, two resistors 78, 80 for detecting voltage V2 are connected between the positive electrode of load 21 and ground 36. With these resistors, voltage at the connecting point of resistors 78, 80 for detecting voltage V2 is detected as voltage proportional to V2. Here, if resistors 78, 80 for detecting voltage V2 are directly connected between the positive electrode of load 21 and ground 36, a current from power source 22 results in always flowing into resistors 78, 80 for detecting voltage V2, causing a great loss. For this reason, first sample switch 82 is series-connected so that resistors 78, 80 for detecting voltage V2 function only when sample and hold are required.

The connecting point of resistors 78, 80 for detecting voltage V2 is connected to capacitor 88 for sample and hold through voltage follower 84 and second sample switch 86. With this connection, after voltage proportional to voltage V2 at the connecting point is copied to capacitor 88 for sample and hold, second sample switch 86 is turned off to hold voltage corresponding to voltage V2. Therefore, first and second sample switches 82, 86 are controlled by control circuit 76 so as to be simultaneously turned on only during sample and hold operation. The voltage output copied to capacitor 88 for sample and hold is input to first error amplifier 56 as an output set value of DC/DC converter 24. If voltage V4 of capacitor 88 for sample and hold previously held is higher than voltage corresponding to voltage V2 required to be held this time, voltage follower 84 is used as a circuit configuration capable of decreasing voltage V4 to voltage corresponding to voltage V2. This voltage follower 84 allows electric charge of capacitor 88 for sample and hold to automatically escape through the ground terminal (not shown) of voltage follower 84 until voltage V4 decreases to voltage corresponding to voltage V2.

Here, a description is made for setting of the resistances of resistors 78, 80 for detecting voltage V2.

In this first embodiment, the output set value of DC/DC converter 24 is determined so that, when voltage V1 of power source 22 drops, voltage supplied from auxiliary power supply 30 to load 21 is lower than the voltage supplied from power source 22 to load 21 in normal times. This reason is described later in the description for operation.

To determine an output set value in this way, voltage lower than that supplied from source 22 to load 21 has only to be preliminarily held as an output set value, by way of example. Concretely, resistors 78, 80 for detecting voltage V2 having resistances with which the voltage decreases at a constant rate have only to be used, for example. In the first embodiment, resistances with which the voltage decreases by approximately 10% is selected.

However, DC/DC converter 24 performs control so that voltage V5 of first I/O terminal 34 becomes an output set value. Rectifier element 32 is connected between first I/O terminal 34 and load 21, thereby causing a voltage drop. Consequently, simply using a resistance with which the voltage decreases at a constant rate results in an excessively low output voltage from auxiliary power supply 30 by the voltage drop. Accordingly, the output set value of DC/DC converter 24 is preliminarily raised by voltage corresponding to a voltage drop at rectifier element 32.

From all of the above, the resistances of resistors 78, 80 for detecting voltage V2 are set so that the voltage is eventually decreased at a constant rate (approximately 10%) while being increased by a voltage drop at rectifier element 32.

Here, an output set value of DC/DC converter 24 is determined by setting resistances of resistors 78, 80 for detecting voltage V2. However, an output set value may be determined by setting resistances of resistors 52, 54 for detecting voltage V5 in the same way as the above.

Next, a description is made for the operation of power supply unit 20 having a structure described above, using FIGS. 1, 2.

The assumption is made that voltage V1 of power source 22 is a certain constant value when power supply unit 20 starts up (time t0) as shown in FIG. 2. In FIG. 2, voltage V1 is shown by a solid line V1(max) and a dotted line V1(min), showing a fluctuation range of power source 22 according to a change in ambient temperature or a deterioration, where the maximum value of voltage V1 is indicated by a solid line and the minimum by a dotted line.

At time t0, since a temporary voltage drop is not occurring in power source 22, power from power source 22 is supplied to load 21 through selection switch 23. Consequently, as shown in FIG. 2, voltage V2 applied to load 21 is constant within the range between solid line V2 (max) and dotted line V2(min) corresponding to the fluctuation range of voltage V1.

At this moment, since power supply unit 20 is in a state immediately after start-up, auxiliary power supply 30 has not been charged yet. Consequently, as shown in FIG. 2, voltage V3 of auxiliary power supply 30 is in a low state at time t0.

In the same way, immediately after power supply unit 20 starts up, since capacitor 88 for sample and hold that sets output voltage of DC/DC converter 24 has not been charged, voltage V4 of capacitor 88 for sample and hold is in a low state at time t0 as shown in FIG. 2.

In this state immediately after start-up, auxiliary power supply 30 needs to be fully charged, to compensate a temporary voltage drop of power source 22, like in a case when operating a starter after stop idling. For this reason, control circuit 76 turns on third switch 26 and sets selector switch 66 to the step-down position as shown in FIG. 2. Meanwhile, since sample timing signal 27 from the ECU is off immediately after start-up, first and second sample switches 82, 86 remain off as shown in FIG. 2.

In this state, control circuit 76 delivers switching start-up signal 77 to drive switching signal generation circuit 68. Since selector switch 66 has been switched to the step-down position, DC/DC converter 24 charges auxiliary power supply 30 with power from power source 22. In this case, DC/DC converter 24 performs control for step-down operation so that voltage V3 corresponds to the voltage of set voltage source 64. Consequently, as shown in FIG. 2, voltage V3 increases as time elapses.

Then, when voltage V3 becomes corresponding to the voltage of set voltage source 64, DC/DC converter 24 operates so that voltage V3 maintains voltage corresponding to that of set voltage source 64. Consequently, voltage V3 is stabilized as shown in FIG. 2.

After that, the assumption is made that the starter is operated to restart the engine after the stop idling of the automobile. Starter operation is performed when a driver changes step from a brake pedal to a gas pedal during a stop, for example. At this moment, the ECU transmits sample timing signal 27 (pulse signal) to control circuit 76 simultaneously with detecting a step change of the pedals. At the time, the starter has not been operated yet.

When control circuit 76 receives sample timing signal 27 at time t1, control circuit 76 immediately turns off third switch 26 and at the same time turns on first and second sample switches 82, 86 as shown in FIG. 2. Consequently, by turning off third switch 26, control circuit 76 cuts power input from power source 22, at first. Meanwhile, by turning on first and second sample switches 82, 86, control circuit 76 copies voltage V2 currently supplied to load 21 to capacitor 88 for sample and hold as a voltage proportional to voltage V2 resistively divided with resistors 78, 80 for detecting voltage V2. Time for charging is required to reach a level at which voltage V4 of capacitor 88 for sample and hold reaches a voltage corresponding to voltage V2. Under the circumstances, as shown in FIG. 2, first and second sample switches 82, 86 are kept on until time t2 (preliminarily determined) when voltage V4 is stabilized with sufficient charge accumulated.

At time t2, voltage V4 becomes stabilized and voltage corresponding to voltage V2 has been sampled. Then, control circuit 76 turns off first and second sample switches 82, 86 as shown in FIG. 2 to hold voltage V4 remaining constant and simultaneously changes selector switch 66 to the step-up position. With this operation, whenever the starter is driven to drop voltage V1, auxiliary power supply 30 is ready to supply load 21 with power.

After that, the ECU is assumed to drive the starter at time t3. This causes a large amount of current to flow from power source 22 to the starter, thereby rapidly dropping voltage V1 as shown in FIG. 2. At this moment, since DC/DC converter 24 has been switched to step-up operation, voltage of auxiliary power supply 30 is increased and supplied to load 21 immediately.

Here, the output voltage of DC/DC converter 24 is controlled so as to be an output set value held at time t2. Consequently, after time t3, voltage V2 can be voltage nearly the same as that before the starter is operated. Consequently, if power source 22 provides a high voltage value as shown by the solid line of voltage V2 in FIG. 2, a voltage close to the voltage value is supplied to load 21. Meanwhile, if power source 22 provides a low voltage value as shown by the dotted line of voltage V2, a voltage close to the voltage value is supplied to load 21. Accordingly, by performing variance control on the output voltage of DC/DC converter 24 so that voltage V4 sampled by sample-and-hold circuit 28 becomes the output set value, the output voltage can follow long-term voltage fluctuation of power source 22. This reduces the possibility that the fluctuation in the difference between the voltage from power source 22 and that the voltage from auxiliary power supply 30 influences the operation of load 21 depending on conditions of power source 22, as seen conventionally.

In the first embodiment, as shown in FIG. 2, arrangement is made so that voltage from auxiliary power supply 30 is slightly lower than the voltage from power source 22. This is because the embodiment is structured so that voltage lower than that supplied from power source 22 to load 21 is preliminarily held as an output set value. The reason for such a structure is to avoid the following possibility. That is, if voltage from auxiliary power supply 30 is higher than the voltage from power source 22, power is supplied from auxiliary power supply 30 to load 21 even if voltage V1 is not low, and the starter has not been operated yet from time t2 to time t3. This causes insufficient power supplied from auxiliary power supply 30 when actually required. Setting the resistances of resistors 78, 80 for detecting voltage V2 for the above purpose is the same as described in the structure of sample-and-hold circuit 28.

During the voltage drop period of voltage V1, power is supplied from auxiliary power supply 30 to load 21, and thus voltage V3 decreases as time lapses after time t3 as shown in FIG. 2.

Then, the assumption is made that starting the engine completes at time t4 and the operation of the starter stops. At this moment, voltage V1 rapidly recovers the voltage before its drop as shown in FIG. 2. As, the output voltage of DC/DC converter 24 is set to a level slightly lower than the voltage of power source 22, supplying load 21 with output from DC/DC converter 24 is stopped by rectifier element 32, and power supply from power source 22 continues. Resultingly, voltage V2 slightly rises and then stays stabilized as shown in FIG. 2. Meanwhile, as supplying load 21 with output from DC/DC converter 24 stops, voltage V3 remains constant at a voltage at time t4.

After that, to fully charge auxiliary power supply 30 again, control circuit 76 turns on third switch 26 at time t5 and changes selector switch 66 to the step-down position as shown in FIG. 2. Since this state is the same as that at time t0, the operation same as that from time t0 to time t1 charges auxiliary power supply 30. Consequently, voltage V3 increases after time t5 as shown in FIG. 2, and when fully charged, operation is performed so as to maintain the voltage.

By repeating the above-described operation, voltage V2 van be maintained at nearly the same voltage even if voltage V1 decreases.

Here, as shown in FIG. 2, after time t5, voltage V4 continues maintaining the voltage held. If sample timing signal 27 is received again in this state to turn on first and second sample switches 82, 86, voltage V4 is updated to voltage corresponding to voltage V2 at the time, where if voltage V4 is lower than voltage corresponding to voltage V2, capacitor 88 for sample and hold is charged until voltage corresponding to voltage V2 is reached. Meanwhile, if voltage V4 is higher than voltage corresponding to voltage V2, discharge is made from capacitor 88 for sample and hold to the ground of voltage follower 84 to a level at which voltage corresponding to voltage V2 is reached as described in the structure of sample-and-hold circuit 28. In this way, sample-and-hold circuit 28 with the structure of the first embodiment enables voltage V4 to be automatically updated to a voltage corresponding to voltage V2 only by turning on first and second sample switches 82, 86.

The above-described structure and operation provide power supply unit 20 in which the difference is always small between voltage of power source 22 in normal times and output voltage of DC/DC converter 24 when the voltage of power source 22 drops.

In the first embodiment, the example is shown where DC/DC converter 24 step ups the voltage of auxiliary power supply 30 to supply load 21 with power. However, the following structure provides the same advantages. That is, a well-known step-down type converter, or step-up and step-down type converters may be used as DC/DC converter 24 that steps down the high voltage of auxiliary power supply 30 to supply power from auxiliary power supply 30 to load 21.

In the first embodiment, the structure is shown in which power source 22 and auxiliary power supply 30 are connected in parallel through DC/DC converter 24. However, power source 22 may be series-connected to auxiliary power supply 30 as shown in FIG. 3. In this case, the other circuit configuration is the same as that of FIG. 1 except that the step-up and step-down positions of selector switch 66 are inverted. In the circuit configuration of FIG. 3, the voltage to charge auxiliary power supply 30 needs to be higher than voltage V1 of power source 22, and thus DC/DC converter 24 is to perform step-up operation when charging. Consequently, during a voltage drop period of power source 22, high voltage V3 of auxiliary power supply 30 is stepped down and supplied to load 2. Accordingly, step-up and step-down operation of DC/DC converter 24 is to be inverted from the operation of FIG. 1, and thus the step-up and step-down positions of the selector switch in FIG. 2 need to be inverted. Temporal operation other than this is the same as that of FIG. 2. However, the voltage drop characteristic of voltage V3 during the voltage drop period (time t3 to t4) of voltage V3 in FIG. 2 is not linear, but has a characteristic given by being combined with fluctuation of voltage V1 during the period t3 to t4 in FIG. 2. In other words, it is a characteristic (not shown) in which the voltage is decreasing like the time-lapse change of voltage V3 in FIG. 2 as a whole while including short-term voltage fluctuation of V1.

With such a structure, in addition to the advantage obtained from the structure of FIG. 1, voltage is stepped down and supplied to load 21 during a voltage drop period, contrarily to the case of FIG. 1, thus resulting in the advantage in that a current flowing is reduced proportionately with a high voltage, and a loss in DC/DC converter 24 is reduced.

In the first embodiment, even after auxiliary power supply 30 is fully charged, for example, DC/DC converter 24 continues to be operated to maintain the fully charged voltage. However, the electric double-layer capacitor with a large capacitance used in auxiliary power supply 30 prevents the voltage from rapidly decreasing even if DC/DC converter 24 is stopped. Therefore, DC/DC converter 24 may be operated only while auxiliary power supply 30 is being charged or discharged. In this case, while DC/DC converter 24 is at a stop, it does not consume power. Accordingly, in addition to the primary advantage that enables stable operation of a load with reduced voltage fluctuation, further efficient power supply unit 20 is obtained.

In the first embodiment, the example is shown where a bidirectional converter is used as DC/DC converter 24, but the invention can use a conventional DC/DC converter with diode rectification as well.

Second Exemplary Embodiment

Figure 4:
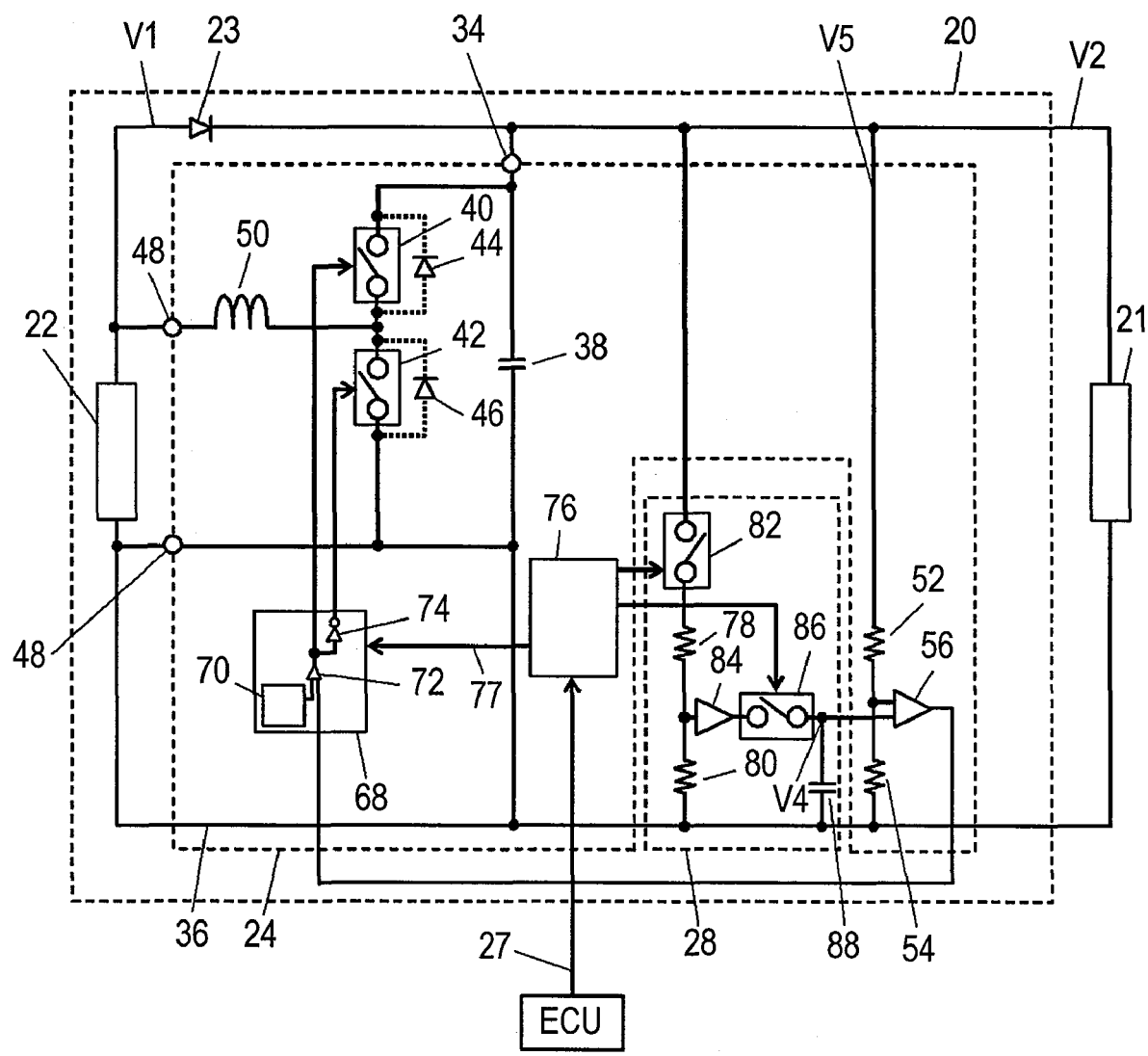
FIG. 4 is a block circuit diagram of a power supply unit according to the second embodiment of the present invention.
Figure 5:
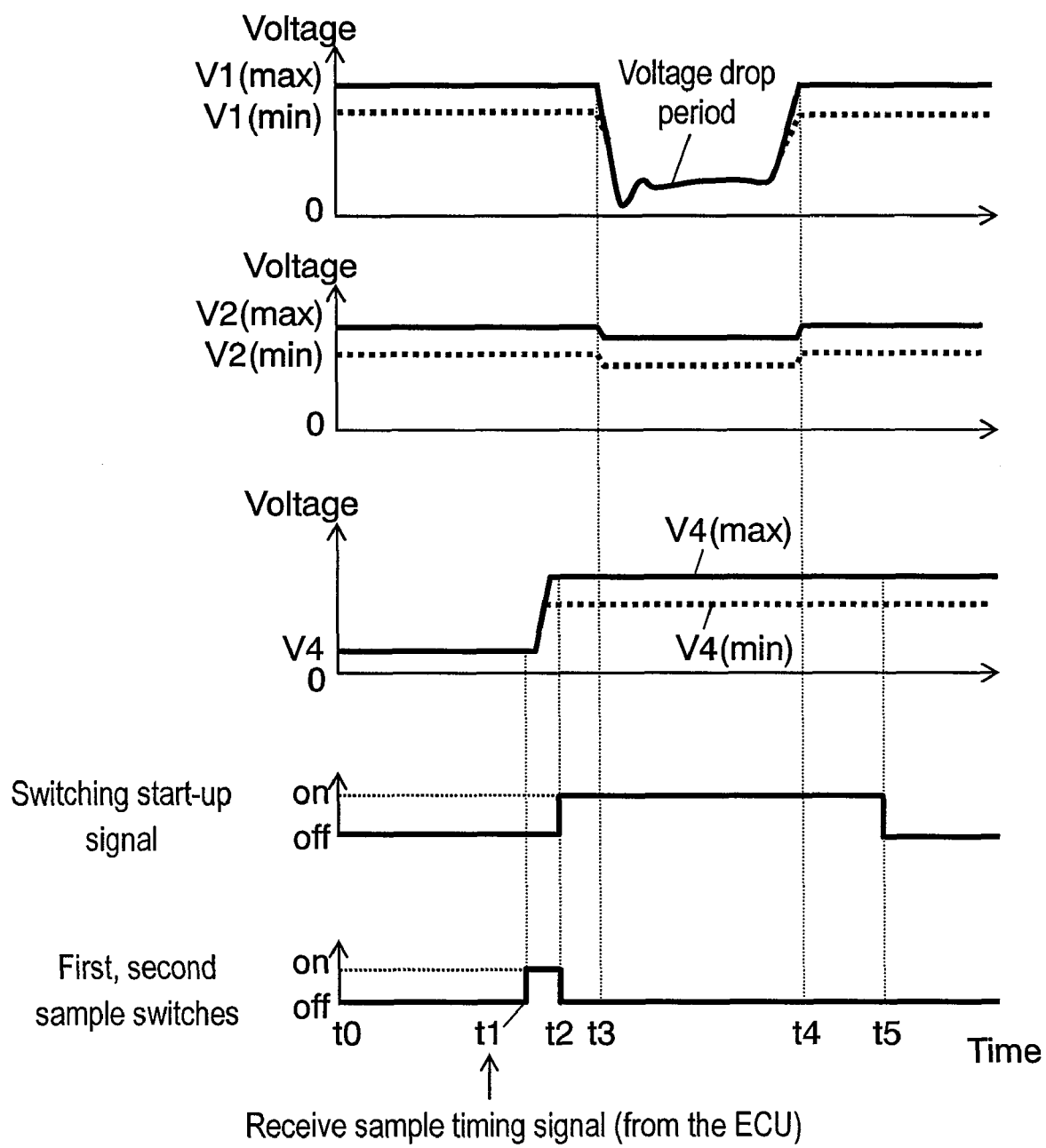
FIG. 5 is a timing diagram showing the operation of the power supply unit according to the second embodiment of the present invention.

FIG. 4 is a block circuit diagram of a power supply unit according to the second embodiment of the present invention. FIG. 5 is a timing diagram showing the operation of the power supply unit according to the second embodiment of the present invention. FIG. 5 includes time-lapse change of voltage V1, time-lapse change of supply voltage V2 to load 21, time-lapse change of voltage V4 of capacitor 88 for sample and hold, an on-off timing diagram of switching start-up signal 77, and an on-off timing diagram of first and second sample switches 82, 86. In FIGS. 4, 5, a component same as that in FIGS. 1, 2 is given the same reference mark to omit its detailed description. In the second embodiment, a description is made for the structure in which, when voltage of a power source (composed of a battery and a power generator) drops, the voltage is stepped up and its DC output is supplied to a load.

First, the structural differences between FIG. 4 and FIG. 1 are (1) through (4) as described below.

(1) Auxiliary power supply 30 is eliminated, and power source 22 is connected to second I/O terminal 48 to which auxiliary power supply 30 has been connected.

(2) Following this change, a step-up converter is used as DC/DC converter 24.

(3) Consequently, step-down control becomes unnecessary, thus resistors 58, 60 for detecting voltage V3, second error amplifier 62, set voltage source 64, and selector switch 66 are eliminated.

(4) Since charge operation for auxiliary power supply 30 by DC/DC converter 24 becomes unnecessary, third switch 26 and rectifier element 32 are eliminated, which results in voltage V5 of first I/O terminal 34 being equal to voltage V2 to load 21.

Although the structures other than the above differences are the same as those in the first embodiment, since rectifier element 32 is not present, its voltage drop does not need to be considered in setting the resistances of resistors 78, 80 for detecting voltage V2. Therefore, a resistance with which simply the voltage decreases at a constant rate (approximately 10%) is selected.

Next, a description is made for the operation of power supply unit 20 with such a structure, using FIGS. 4, 5.

The assumption is made that voltage V1 of power source 22 is a certain constant value when power supply unit 20 starts up (time t0) as shown in FIG. 5. Here, solid lines V1(max), V2(max) and dotted lines V1(min), V2(min) in FIG. 5 mean the same as those in FIG. 2.

Since a temporary voltage drop of power source 22 does not occur at time t0, power from power source 22 is supplied to load 21 through selection switch 23. Consequently, as shown in FIG. 5, voltage V2 at load 21 remains constant within the range between the solid line and broken line corresponding to the fluctuation range of voltage V1.

At this moment, power supply unit 20 is in a state immediately after start-up, and thus capacitor 88 for sample and hold that sets output voltage of DC/DC converter 24 is not charged. Consequently, voltage V4 of capacitor 88 for sample and hold is in a low state at time t0 as shown in FIG. 5.

In this state immediately after start-up, a temporary voltage drop of power source 22 does not occur, and thus DC/DC converter 24 does not need to be started up. Therefore, control circuit 76 keeps switching start-up signal 77 off as shown in FIG. 5. In the same way, sample timing signal 27 from the ECU is off immediately after start-up, and thus first and second sample switches 82, 86 remain off as well as shown in FIG. 5.

Then, after the automobile stops idling, for example, when the starter is activated to restart the engine, the ECU delivers sample timing signal 27 (pulse signal) to control circuit 76 immediately before activating the starter.

If control circuit 76 is assumed to receive sample timing signal 27 at time t1, control circuit 76 immediately turns on first and second sample switches 82, 86 as shown in FIG. 5. Consequently, voltage V2 currently supplied to load 21 is copied to capacitor 88 for sample and hold as voltage proportional to voltage V2 resistively divided with resistors 78, 80 for detecting voltage V2. At this moment, time for charging is required to at least a level at which voltage V4 of capacitor 88 for sample and hold reaches voltage corresponding to voltage V2. Under the circumstances, as shown in FIG. 5, first and second sample switches 82, 86 are kept on until time t2 (preliminarily determined) when voltage V4 is stabilized with sufficient charge accumulated.

At time t2, voltage V4 becomes stable and voltage corresponding to voltage V2 results in having been sampled. Under the circumstances, control circuit 76 turns off first and second sample switches 82, 86 as shown in FIG. 5 to hold voltage V4 remaining constant and simultaneously turns on switching start-up signal 77 as shown in FIG. 5.

Here, as described later, voltage V2 output from DC/DC converter 24 is set to a level slightly lower than output voltage V1 of power source 22. However, since DC/DC converter 24 of the second embodiment is of step-up type, it cannot convert the voltage V2 lower than input voltage V1 of DC/DC converter 24 at time t2. In this case, switching signal generation circuit 68 performs control so as to operate for the lowest possible step-up ratio, namely to operate so that second switch 42 remain off and first switch 40 remain on. Consequently, DC/DC converter 24 results in being activated so as to step up the voltage of power source 22 to be able to supply load 21 whenever the starter is driven to drop voltage V1. This results in power supply from power source 22 to load 21 executed by means of wiring through selection switch 23 and of wiring through the series circuit of coil 50 and first switch 40.

After that, the ECU is assumed to drive the starter at time t3. Then, a large amount of current flows from power source 22 to the starter, which causes voltage V1 to be dropped rapidly as shown in FIG. 5. At this moment, although voltage V2 simultaneously drops, step-up operation can be started at a time point when voltage V2 decreases to an output set value, because DC/DC converter 24 has been already started up. Consequently, DC/DC converter 24 steps up the low voltage of power source 22 and immediately supplies power from first I/O terminal 34 to load 21, thereby stabilizing voltage V2.

Here, output voltage of DC/DC converter 24 is controlled so as to be an output set value held at time t2. Consequently, as described in the first embodiment, voltage V2 can be set to nearly the same voltage as the voltage before the starter operation. This reduces the possibility that the fluctuation in the difference of voltage V2 between before and after the starter operation, that depends on conditions of power source 22 and influences the operation of load 21 as seen conventionally.

In the second embodiment, as shown in the characteristic of voltage V2 in FIG. 5, the voltage from DC/DC converter 24 is set to a level slightly lower than the voltage from power source 22 because of the following reason. If the voltage from DC/DC converter 24 is higher than the voltage from power source 22, power is supplied from DC/DC converter 24 to load 21 even when the starter has not been operated yet and voltage V1 has not been decreased during the period from time t2 to time t3. In this case, DC/DC converter 24 produces a loss, and thus such voltage setting is made to reduce any unnecessary power consumption due to the loss.

Next, the assumption is made that the engine start completes at time t4 to stop the starter operation. At this moment, as shown in FIG. 5, voltage V1 rapidly recovers the voltage before its drop. Consequently, as described above, second switch 42 of DC/DC converter 24 remains off and first switch 40 remains on because the output voltage of DC/DC converter

24 is set to a level slightly lower than that from power source 22. At this moment, power to load 21 is continuously supplied through the wiring of selection switch 23 and that of the series circuit of coil 50 and first switch 40. Resultingly, voltage V2 slightly rises and then stays stabilized as shown in FIG. 5.

After that, to stop the operation of DC/DC converter 24, control circuit 76 turns off switching start-up signal 77 at time t5 as shown in FIG. 5, resulting in the same state as that at time t0.

By repeating the above-described operation, voltage V2 can be maintained at a level nearly the same even if voltage V1 drops. Here, updating voltage V4 after time t5 is performed with the same operation as that in the first embodiment.

The above-described structure and operation provide power supply unit 20 in which the difference is always small between the voltage of power source 22 in normal times and the output voltage of DC/DC converter 24 when the voltage of power source 22 drops.

In the second embodiment, control is performed so as to stop the operation of DC/DC converter 24 when switching start-up signal 77 is off. However, in normal times during which the voltage of power source 22 is not low, namely when switching start-up signal 77 is off, switching signal generation circuit 68 may be operated so that only first switch 40 connected between the input and output of DC/DC converter 24 (i.e. between first I/O terminal 34 and second I/O terminal 48) is turned on. With this method, power is supplied from power source 22 to load 21 through DC/DC converter 24 even when switching start-up signal 77 is off. When operated in this way, voltage V2 becomes equal to voltage V1 because first switch 40 is on in normal times. Consequently, voltage V4 sampled and held becomes correspond to voltage V1, and thus the output voltage of DC/DC converter 24 is not subject to the influence of a voltage drop at selection switch 23, thereby further reducing the difference between voltage supplied to load 21 in normal times and that when the voltage of power source 22 drops. Accordingly, the advantage is available in that voltage V2 is further stabilized. In this case, power from power source 22 is supplied to load 21 through coil 50 and first switch 40, and the wiring through selection switch 23 may be eliminated.

In the second embodiment, the description is made for the structure in which rectifier element 32 is not provided. However, rectifier element 32 may be provided at the same position as that in the first embodiment. Herewith, even if smoothing capacitor 38, first switch 40, or second switch 42 fails with a short circuit in the worst case, a problem in which a current from power source 22 flows to ground 36 is prevented, thereby improving the reliability. In this case, however, the resistances of resistors 78, 80 for detecting voltage V2 needs to be set in consideration of a voltage drop at rectifier element 32 in the same way as in the first embodiment.

In the second embodiment, the example is shown where a synchronously rectifying step-up converter is used as DC/DC converter 24, but a conventional DC/DC converter with diode rectification may be used.

The structures described in the first and second embodiments may be applied to a large current consuming system such as an electromotive power steering and electromotive turbocharger in addition to stop idling.

Third Exemplary Embodiment

Figure 6:
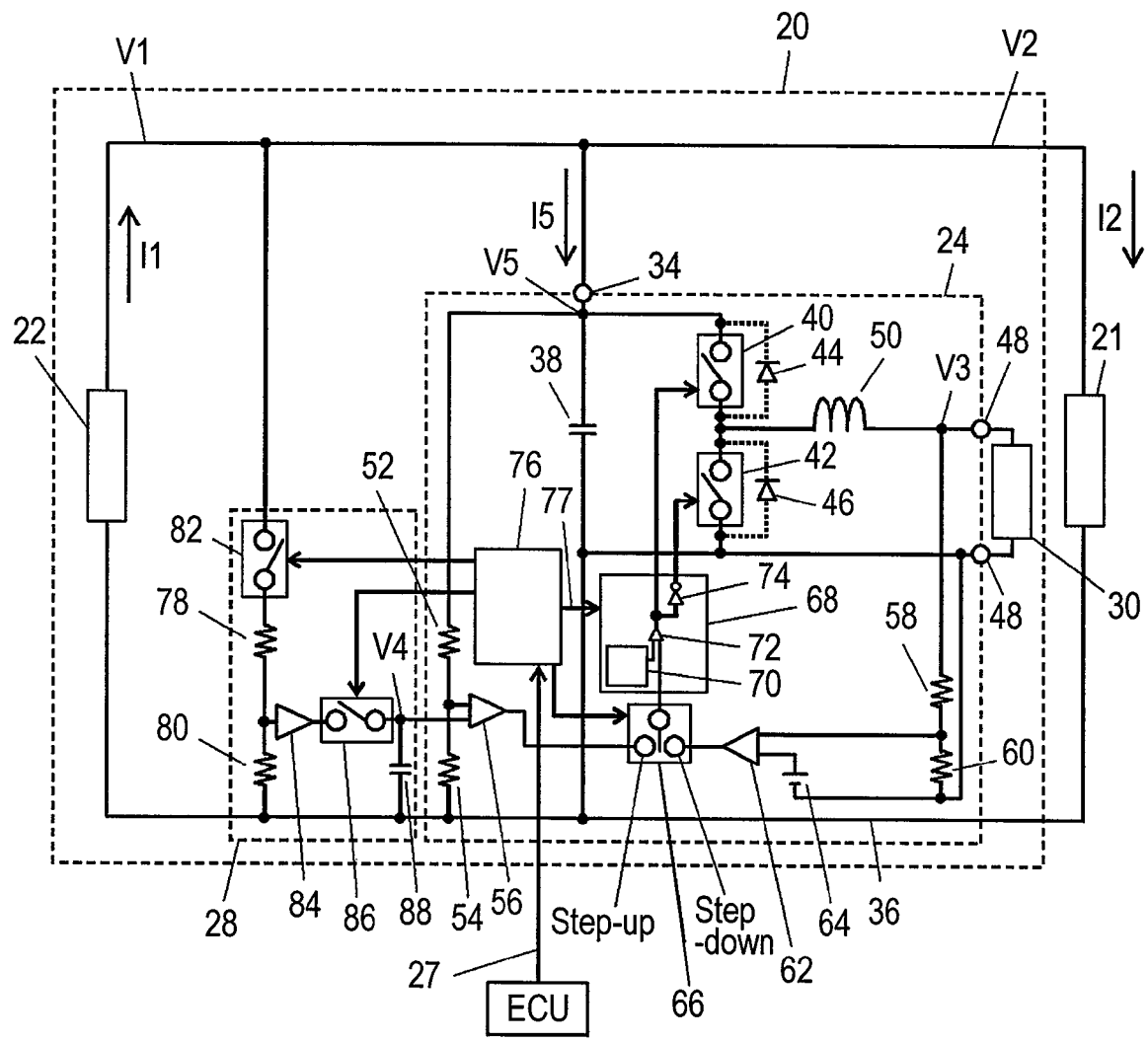
FIG. 6 is a block circuit diagram of a power supply unit according to the third embodiment of the present invention.
Figure 7:
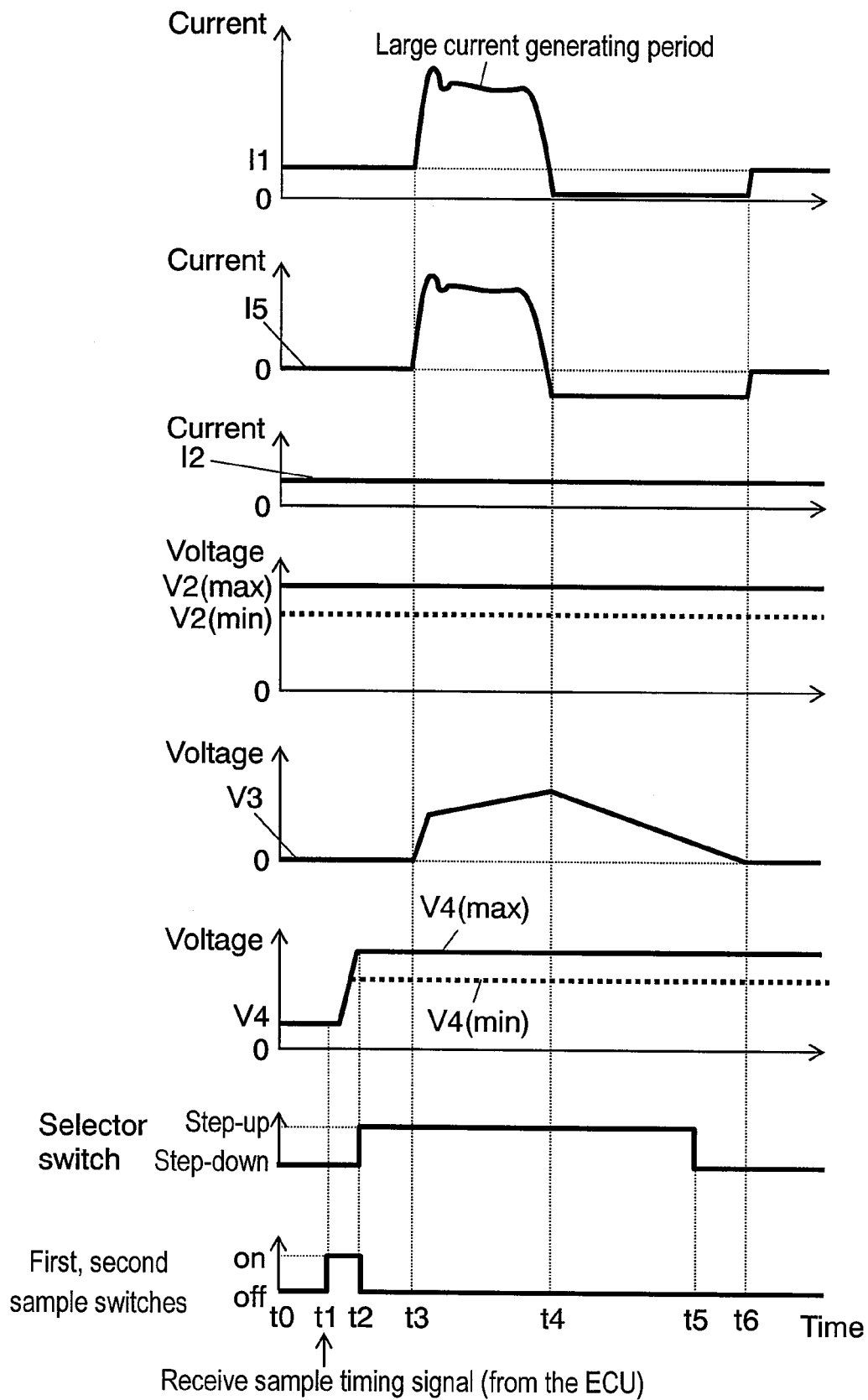
FIG. 7 is a timing diagram showing the operation of the power supply unit according to the third embodiment of the present invention.

FIG. 6 is a block circuit diagram of a power supply unit according to the third embodiment of the present invention. FIG. 7 is a timing diagram showing the operation of the power supply unit according to the third embodiment of the present invention. FIG. 7 includes time-lapse change of current I1 from power source 22, time-lapse change of current I5 to DC/DC converter, time-lapse change of current I2 to load 21, time-lapse change of voltage V2 at load 21, time-lapse change of voltage V3 of auxiliary power supply 30, time-lapse change of voltage V4 of capacitor 88 for sample and hold, a switching timing diagram of selector switch 66, and an on-off timing diagram of first and second sample switches 82, 86. In FIG. 6, a component same as that in FIG. 1 is given the same reference mark to omit its detailed description. An arrow in FIG. 6 indicates a current flow, where the direction of the arrow is defined as a positive current.

In the third embodiment, a description is made for the following case. That is, when the voltage of a power source temporarily rises due to such as regeneration of braking energy to electric energy, this rising fluctuation portion is voltage-converted by a DC/DC converter and absorbed by an auxiliary power supply, and power of the auxiliary power supply is discharged in normal times when regeneration is not performed.

First, the structural differences between FIG. 6 and FIG. 1 are (1) through (3) below.

(1) In the third embodiment, a description is made for a case where a voltage drop at power source 22 as in the first embodiment does not occur, and thus output from DC/DC converter 24 does not backflow to power source 22. Consequently, selection switch 23 for preventing backflow is unnecessary and eliminated.

(2) In the first embodiment, third switch 26 is provided so that excessive power does not flow out to outside unless necessary when auxiliary power supply 30 is fully charged. In the third embodiment, third switch 26 is eliminated so that regenerated power is ready to be used for charge any time. Following this, rectifier element 32 is eliminated as well.

(3) The chargeable capacity of auxiliary power supply 30 is set to a level at which all the maximum electric energy in regeneration can be absorbed.

The other structures other than the above are the same as those in the first embodiment. However, since rectifier element 32 is not present as well as in the second embodiment, its voltage drop does not need to be considered in setting the resistances of resistors 78, 80 for detecting voltage V2. Therefore, a resistance with which voltage from power source 22 becomes equal to that from auxiliary power supply 30 is selected.

Next, a description is made for the operation of power supply unit 20, using FIGS. 6, 7.

In normal times (time t0) after power supply unit 20 completes start-up, current I1 flowing from power source 22 is assumed to be a constant value consumed by load 21 as shown in FIG. 7.

Meanwhile, although auxiliary power supply 30 is in a state discharged at time t0, control needs to be performed so that auxiliary power supply 30 is not charged in order to collect all the energy generated by regeneration. Accordingly, auxiliary power supply 30 has circuit configuration in which it is charged through DC/DC converter 24, and thus control is performed so that current I5 to DC/DC converter 24 becomes zero as shown in FIG. 7. An electric double layer capacitor fully dischargeable is used as auxiliary power supply 30.

If load 21 is assumed to be always consuming constant current I2 while the vehicle is being used, constant current I2 flows through load 21 at time t0 as shown in FIG. 7, and thus I1=I2 at time t0.

Meanwhile, voltage V2 applied to load 21 is controlled so as to be always constant within an operable voltage range while the vehicle is being used, and thus voltage V2 remains constant at time t0 as shown in FIG. 7. Here, solid lines V2(max) and dotted lines V2(min) in FIG. 7 mean the same as those in FIG. 2.

Auxiliary power supply 30 is not charged at time t0 as described above, and thus voltage V3 of auxiliary power supply 30 is zero as shown in FIG. 7.

When power supply unit 20 completes start-up, capacitor 88 for sample and hold that sets voltage (output voltage) at first I/O terminal 34 of DC/DC converter 24 is not sufficiently charged, and thus voltage V4 of capacitor 88 for sample and hold is in a low state at time t0 as shown in FIG. 7.

Here, a description is made for the operation of each switch using timing diagrams.

First, to prevent auxiliary power supply 30 from being charged at time t0, control circuit 76 performs control so that selector switch 66 selects the step-down position (second error amplifier 62 side). The set voltage of set voltage source 64 connected to second error amplifier 62 is set to the lowest possible voltage (e.g. 1 V) at which DC/DC converter 24 can perform step-up operation, and thus with the above-described selection, DC/DC converter 24 is charge-controlled so that voltage V3 of auxiliary power supply 30 becomes the set voltage. Once auxiliary power supply 30 is charged, the charge operation stops.

Next, since sample timing signal 27 from the ECU is off at time t0, both of the first and second sample switches 82 and 86 remain off as shown in FIG. 7.

The driver is assumed to execute braking operation in this state. With this operation, a braking signal is input to the ECU on the vehicle from the brake pedal. With the signal, the ECU immediately delivers sample timing signal 27 to control circuit 76. At the time point, the power generator has not performed regeneration yet.

If control circuit 76 is assumed to receive sample timing signal 27 at time t1, control circuit 76 immediately turns on first and second sample switches 82, 86 as shown in FIG. 7. Consequently, in the same way as in the first embodiment, voltage corresponding to voltage V2 currently supplied to load 21 is copied to capacitor 88 for sample and hold. At this moment, time for charging is required to at least a voltage V4 of capacitor 88 for sample and hold reaches voltage corresponding to voltage V2. Under the circumstances, as shown in FIG. 7, first and second sample switches 82, 86 are kept on until time t2 (preliminarily determined) when voltage V4 becomes stabilized with sufficient charge accumulated.

At time t2, voltage V4 becomes stable and voltage corresponding to voltage V2 results in having been sampled. Then, control circuit 76 turns off first and second sample switches 82, 86 as shown in FIG. 7 to hold voltage V4 constant, and simultaneously switches selector switch 66 to the step-up position as shown in FIG. 7. At this moment, operation is performed so that output of DC/DC converter 24 becomes voltage immediately before (voltage held). Consequently, auxiliary power supply 30 is hardly charged or discharged until a regenerative current is generated. Whenever current I1 increases after time t2 due to regeneration, preparation is made with the operation so that the increase is absorbed by charging auxiliary power supply 30 with regenerative electric power.

After that, regeneration operation for vehicle braking is assumed to start at time t3. This causes a large amount of current to flow from power source 22 temporarily, thereby rapidly increasing current I1 as shown in FIG. 7. At this moment, DC/DC converter 24 performs control so that voltage V5 at first I/O terminal 34 becomes voltage V4 sampled and held, and thus temporary fluctuating current I5 due to regeneration as shown in FIG. 7 is absorbed by charging auxiliary power supply 30 to lower an increase of voltage V5 according to an increase of current I1 to voltage V4.

The operation allows continuing to supply load 21 with current I2 of almost the same amount as before the regeneration as shown in FIG. 7.

Further, control is performed so that voltage V5 at first I/O terminal 34 of DC/DC converter 24 becomes an output set value held at time t2, and thus voltage V2 is almost the same voltage as that the voltage before regeneration operation. Consequently, if power source 22 supplies a high voltage as shown by the solid line in FIG. 7, voltage V2(max) almost the same as the high voltage is supplied to load 21. If power source 22 supplies a low voltage as shown by the dotted line, voltage V2(min) almost the same as the low voltage is supplied to load 21. Accordingly, by exercising variance control on output voltage of DC/DC converter 24 so that voltage V4 sampled by sample-and-hold circuit 28 becomes the output set value, voltage V5 at first I/O terminal 34 can be made follow long-term voltage fluctuation of power source 22 in the same way as in the first and second embodiments. This reduces the possibility that the fluctuation in the difference between voltage from power source 22 and that from auxiliary power supply 30 depending on conditions of power source 22 influences the operation of load 21 as seen conventionally.

In the third embodiment, power is not supplied from auxiliary power supply 30 to load 21 during a voltage drop period of power source 22 as seen in the first embodiment, and thus the possibility does not exist inherently that power from auxiliary power supply 30 becomes deficient when necessary. Consequently, an output set value does not need to be set so that voltage from auxiliary power supply 30 is slightly lower than the voltage from power source 22 as shown by the time-lapse change of current I5 in FIG. 2. Accordingly, as shown in FIG. 7, even during a large current generating period due to regeneration operation, voltage V2 is to be almost the same voltage as in normal times when the regeneration operation does not take place. This operation reduces fluctuation in voltage to load 21 to the extent as soon as possible.

During a large current generating period, temporary fluctuation portion 15 of current I1 of power source 22 is absorbed by charging auxiliary power supply 30 through DC/DC converter 24, and thus voltage V3 temporally increases after time t3 as shown by the time-lapse change of voltage V3 in FIG. 7.

Then, the regeneration operation is assumed to end at time t4. At this moment, as shown in FIG. 7, current I1 rapidly decreases and hardly flows from power source 22. This is because control is performed so that charge power absorbed by auxiliary power supply 30 during a large current generating period is preferentially discharged to prepare for reabsorbing a fluctuation portion of a current in the next large current generating period.

As a result, as shown by the time-lapse change of current I5 in FIG. 7, current I5 at first I/O terminal 34 flows in the negative direction to be supplied to load 21 after time t4, resulting in I2□−I5. Accordingly, as shown by the time-lapse change of current I2 in FIG. 7, the same amount of current I2 is continuously supplied to load 21 after time t4, and as shown by the time-lapse change of voltage V2 in FIG. 7, voltage V2 at load 21 is kept constant.

Following this, as power from auxiliary power supply 30 is supplied to load 21, voltage V3 temporally decreases after time t4. Auxiliary power supply 30 needs to be completely discharged to absorb a next temporary fluctuation portion of a large amount of current. Under the circumstances, control circuit 76 changes selector switch 66 to the step-down position at time t5. With this action, DC/DC converter 24 operates so that voltage V3 of auxiliary power supply 30 becomes voltage of set voltage source 64. Consequently, power of auxiliary power supply 30 is completely discharged and its state is maintained.

Circumstances of the operation at this moment are shown as the time-lapse change of voltage V3 in FIG. 7. Voltage V3 becomes 0 V at time t6 and retains 0 V from then on. With such operation, power cannot be supplied from auxiliary power supply 30 to load 21 after time t6, and thus current I1 is supplied from power source 22 to load 21 at this time point as shown by the time-lapse change of current I1 in FIG. 7. At this moment, auxiliary power supply 30 has completed discharge as shown by the time-lapse change of current I5 in FIG. 7, and thus current I5 at first I/O terminal 34 becomes zero.

With the above operation, current I2 and voltage V2 to load 21 always retain the same values, enabling load 21 to continue operating stably.

By repeating the above-described operation, current I2 and voltage V2 can retain the roughly same values even when current I1 increases. Here, time t5 when selector switch 66 is changed may be any time between t4 and t6. Updating voltage V4 held is executed in the same way as in the first embodiment.

The above-described structure and operation implement power supply unit 20 in which the difference is always small between the voltage of power source 22 in normal times and the output voltage of DC/DC converter 24 when temporarily fluctuating due to a large amount of current from power source 22.

In the third embodiment, an electric double layer capacitor is used as auxiliary power supply 30. However, another storage element such as an electrochemical capacitor that is capable of rapidly charging and discharging may be used.

Fourth Exemplary Embodiment

Figure 8:
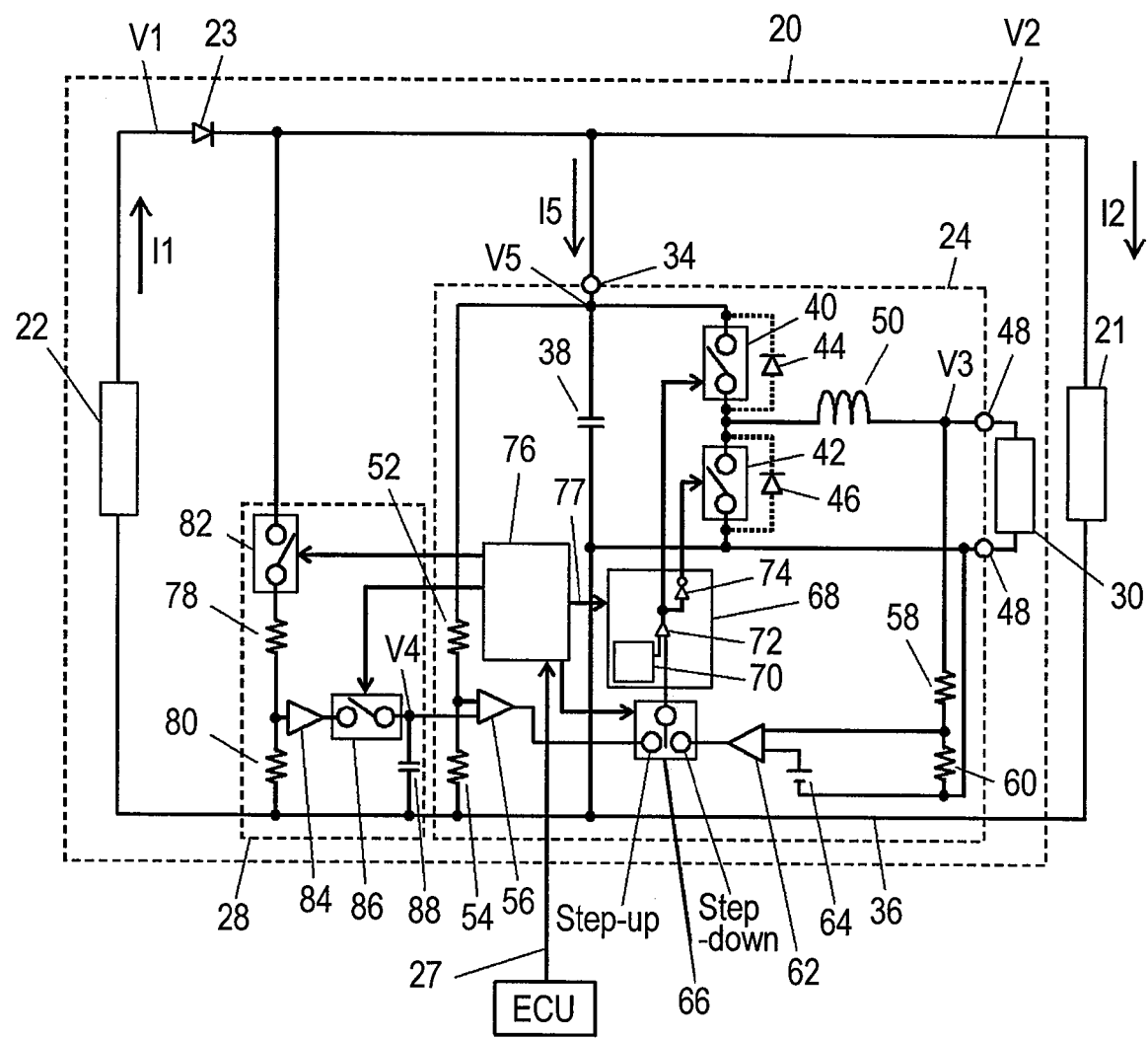
FIG. 8 is a block circuit diagram of a power supply unit according to the fourth embodiment of the present invention.
Figure 9:
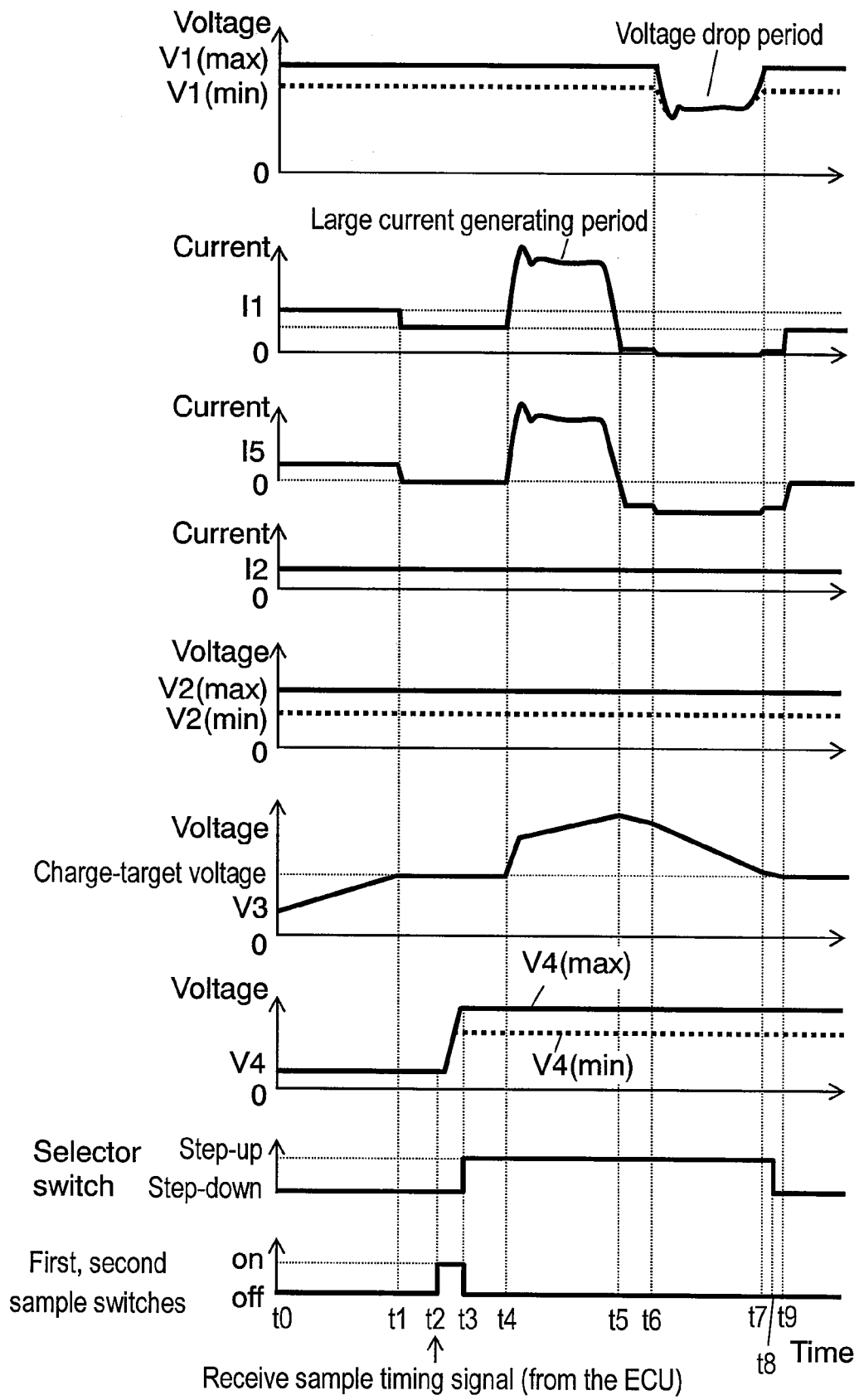
FIG. 9 is a timing diagram showing the operation of the power supply unit according to the fourth embodiment of the present invention.

FIG. 8 is a block circuit diagram of a power supply unit according to the fourth embodiment of the present invention. FIG. 9 is a timing diagram showing the operation of the power supply unit according to the fourth embodiment of the present invention. FIG. 9 includes time-lapse change of voltage V1 of power source 22, time-lapse change of current I1 from power source 22, time-lapse change of current I5 to a DC/DC converter, time-lapse change of current I2 to load 21, time-lapse change of voltage V2 at load 21, time-lapse change of voltage V3 of auxiliary power supply 30, time-lapse change of voltage V4 of a capacitor for sample and hold, a switching timing diagram of selector switch 66, and an on-off timing diagram of first and second sample switches 82, 86. In FIG. 8, a component same as that in FIGS. 1, 6 is given the same reference mark to omit its detailed description. An arrow in FIG. 8 means the same as that in FIG. 6.

In the fourth embodiment, a description is made for a power supply unit supplying a load with stable power even when both the following occur. That is, a case where both the first and third embodiments are simultaneously performed, namely when voltage of the power source temporarily rises due to such as regeneration operation by braking; and when voltage of the power source temporarily drops due to consumption of a large amount of current by the starter.

First, the structural differences between FIG. 8 and FIG. 6 are described below. Since the fourth embodiment includes a case where a voltage drop at power source 22 occurs in the same way as in the first embodiment, selection switch 23 is provided to prevent backflow of output from DC/DC converter 24 to power source 22. Accordingly, the operation of selection switch 23 is corresponding to that switching between output from power source 22 and that from DC/DC converter 24 as a power source to load 21 in the same way as in the first embodiment.

The structures other than the above are the same as those in the first and third embodiments. Setting the resistances of resistors 78, 80 for detecting voltage V2 is made so that voltage from power source 22 becomes the same as that from auxiliary power supply 30 in the same way as in the third embodiment.

Next, a description is made for the operation of power supply unit 20 with such a structure, using FIGS. 8, 9.

In normal times (time t0) after power supply unit 20 completes start-up, when neither generation of a large amount of current nor a voltage drop occurs, voltage V1 of power source 22 is assumed to be constant as shown in FIG. 9. Here, solid line V1(max) and dotted line V1 (min) in FIG. 9 mean the same as those in the first embodiment. In this case, current I1 flowing from current supply source 22 is a constant value corresponding to the sum of consumption current I2 due to driving load 21 and charging current I5 to auxiliary power supply 30, as shown in FIG. 9. Consequently, charging current I5 to auxiliary power supply 30 and current I2 to load 21 are constant values as well, as shown in FIG. 9. Resultingly, voltage V2 applied to load 21 retains a constant value as well, as shown in FIG. 9. These are because control is performed so that load 21 always consumes constant current I2 and because constant voltage V2 is always retained within an operable voltage range while the vehicle is being used, in the same way as in the third embodiment.

Auxiliary power supply 30 is charged until target voltage is reached as shown in FIG. 9, and thus voltage V3 of auxiliary power supply 30 temporally rises from a low state at time t0. Here, though in the first embodiment, auxiliary power supply 30 is fully charged, in the third embodiment, control is performed so as not to charge auxiliary power supply 30. In the fourth embodiment, meanwhile, auxiliary power supply 30 is charged to a charge-target voltage between an uncharged state and fully charged state. This is because auxiliary power supply 30 is made to have a margin for an absorbed portion so that it can absorb and charge whenever a large current generating period begins. The auxiliary power supply 30 is preliminarily charged to a level at which auxiliary power supply 30 can supply load 21 with power whenever a voltage drop period begins. Therefore, control is performed so that charge-target voltage is always retained in a normal state by discharging power absorbed promptly after a large current generating period ends and by charging a portion of power used promptly after a voltage drop period ends. For this arrangement, the capacity of auxiliary power supply 30 is to be a sum of a capacity required for absorbing power during a large current generating period and a capacity is required for discharging during the voltage drop period. With this capacity, a charge-target voltage is set so that an amount of charge is large enough to supply load 21 with power during the voltage drop period.

When power supply unit 20 completes start-up, capacitor 88 for sample and hold that sets voltage (output voltage) at first I/O terminal 34 of DC/DC converter 24 is not sufficiently charged, and thus voltage V4 of capacitor 88 for sample and hold is in a low state at time t0, as shown in FIG. 9.

In this state (time t0) after start-up completes, to compensate a temporary voltage drop of power source 22 during the voltage drop period, auxiliary power supply 30 needs to be charged to charge-target voltage as described above. For this purpose, control circuit 76 turns selector switch 66 to the step-down position as shown in FIG. 9. After start-up completes, sample timing signal 27 from the ECU is off, and thus first and second sample switches 82, 86 remain off as shown in FIG. 9.

In this state, control circuit 76 delivers switching start-up signal 77 to drive switching signal generation circuit 68. With this operation, DC/DC converter 24 charges auxiliary power supply 30 with power from power source 22 because selector switch 66 is turned to the step-down position. In this case, DC/DC converter 24 performs step-down control so that voltage V3 corresponds to voltage (charge-target voltage) of set voltage source 64. Consequently, voltage V3 increases as time elapses as shown in FIG. 9.

Then, when voltage V3 becomes voltage corresponding to a voltage of set voltage source 64, DC/DC converter 24 operates so that voltage V3 maintains voltage corresponding to that the voltage of set voltage source 64. Consequently, voltage V3 becomes stabilized at time t1 as shown in FIG. 9. This operation completes charge to auxiliary power supply 30, and thus current I5 for charging auxiliary power supply 30 becomes zero as shown by the time-lapse change of current I5 in FIG. 9. Consequently, current I1 decreases to a level same as load consumption current I2 at time t1 as shown in FIG. 9 because power source 22 needs to pass only current I2 through load 21.

In this state, the driver is assumed to perform braking operation. This operation causes a braking signal to be input from the brake pedal to the ECU of the vehicle. With this input, the ECU transmits sample timing signal 27 to control circuit 76 immediately. At this time, the power generator has not performed regeneration operation.

If control circuit 76 is assumed to receive sample timing signal 27 at time t2, control circuit 76 immediately turns on first and second sample switches 82, 86 as shown in FIG. 9. As a result, in the same way as in the third embodiment, voltage corresponding to voltage V2 currently supplied to load 21 is copied to capacitor 88 for sample and hold. At time t3 when sample and hold complete, voltage V4 becomes stabilized as shown in FIG. 9, and thus control circuit 76 turns off first and second sample switches 82, 86 to hold voltage V4 remaining constant as shown in FIG. 9. Simultaneously with that, control circuit 76 changes selector switch 66 to the step-up position as shown in FIG. 9. With this operation, preparation is made so that auxiliary power supply 30 absorbs regenerative electric power or compensates a voltage drop whenever current I1 increases due to regeneration operation or voltage V1 decreases due to consumption of a large amount of current after time t3.

After that, regeneration operation for vehicle braking is assumed to start at time t4. This causes a large amount of current to flow from power source 22 temporarily, thereby rapidly increasing current I1 as shown in FIG. 9. At this moment, DC/DC converter 24 performs control so that voltage V5 at first I/O terminal 34 becomes voltage V4 sampled and held, and thus temporary fluctuating current I5 due to regeneration is absorbed by charging auxiliary power supply 30 through DC/DC converter 24 to lower an increase of voltage V5 according to an increase of current I1 to voltage V4.

The operation allows continuing to supply load 21 with current I2 of almost the same amount as that before regeneration operation as shown in FIG. 9.

Further, control is performed so that voltage V5 at first I/O terminal 34 of DC/DC converter 24 becomes an output set value held at time t2, and thus voltages V1 and V2 are almost the same as those before regeneration operation. Consequently, if power source 22 supplies a high voltage as shown by solid line V1(max) and V2(max) in FIG. 9, the voltage becomes almost the same as them. If power source 22 supplies a low voltage as shown by dotted line V1(min) and V2(min), the voltage becomes almost the same as them. Accordingly, voltage V5 at first I/O terminal 34 can be made follow long-term voltage fluctuation of power source 22 in the same way as in the embodiments first through third. This reduces the possibility that the fluctuation in the difference between voltage from power source 22 and that from auxiliary power supply 30 depending on conditions of power source 22 influences the operation of load 21 as seen conventionally.

During a large current generating period, temporary fluctuation portion 15 of current I1 from power source 22 is absorbed by charging auxiliary power supply 30 through DC/DC converter 24, and thus voltage V3 temporally increases after time t4 as shown in FIG. 9.

Then, the assumption is made that the regeneration operation ends and the vehicle stops (stop idling) at time t5. At this moment, current I1 rapidly drops as shown in FIG. 9 and current I1 hardly flows from power source 22. This is because control is performed so that charge power absorbed by auxiliary power supply 30 during the large current generating period is preferentially discharged to prepare for reabsorbing a fluctuation portion of a current in the next large current generating period.

As a result, as shown by the time-lapse change of current I5 in FIG. 9, current I5 at first I/O terminal 34 flows in the negative direction to be supplied to load 21 after time t5, resulting in I2□−I5. Accordingly, even when the engine stops for stop idling, as shown by the time-lapse change of current I2 in FIG. 9, the same amount of current I2 is continuously supplied to load 21 after time t5, and as shown in FIG. 9, voltage V2 at load 21 is kept constant.

Following this, as power from auxiliary power supply 30 is supplied to load 21, voltage V3 temporally decreases after time t5.

After that, the assumption is made that the starter is operated to restart the engine. Starter operation is performed when the driver changes step from the brake pedal to the gas pedal during a stop, for example. Accordingly, the ECU transmits sample timing signal 27 to control circuit 76 simultaneously with detecting a step change of the pedals. At the time, the starter has not been operated yet.

Under normal circumstances, voltage V2 currently supplied to load 21 at this time is copied to capacitor 88 for sample and hold. However, since the time from regeneration operation until restart of the starter is usually short, during which the environmental temperature and deterioration of the battery are not supposed to change suddenly, voltage V4 already having been sampled and held at time t3 is continuously used here. Therefore, sample and hold operation is not performed after time t5.

After that, the ECU is assumed to drive the starter at time t6 while electric energy absorbed by auxiliary power supply 30 in regeneration operation is being discharged to load 21. This causes a large amount of current to flow from power source 22 to the starter, thereby rapidly decreasing voltage V1 as shown in FIG. 9. At this time, power has been already supplied from auxiliary power supply to load 21, and thus power is continuously supplied to load 21 after time t6.

Here, at time t6, nearly all the current from power source 22 flows to the starter, and thus a small amount of current I1 that was flowing to load 21 at time t5 becomes completely zero at time t6 as shown in FIG. 9. Therefore, to continue passing stable current I2 through load 21, auxiliary power supply 30 needs to pass a current including that equivalent to current I1. Accordingly, as shown by the time-lapse change of current I5 in FIG. 9, I5 slightly increases to the negative side at time t6. Consequently, current I2 is stabilized after time t6 and voltage V2 at load 21 is stable as well, as shown in FIG. 9.

With such operation, voltage V2 can be set to nearly the same voltage as that before the starter operation even during the voltage drop period, and thus the output voltage of DC/DC converter 24 can be made follow long-term voltage fluctuation of power source 22. In the fourth embodiment as well, this reduces the possibility that the fluctuation in the difference between voltage from power source 22 and that from auxiliary power supply 30 depending on conditions of power source 22 influences the operation of load 21 as seen conventionally.

During the voltage drop period of voltage V1, power is supplied from auxiliary power supply 30 to load 21, and thus as shown in the time-lapse change of voltage V3 in FIG. 9, voltage V3 temporally decreases after time t6. In this case, since current I1 from current supply source 22 is zero, a declination of voltage V3 from time t6 to t7 is slightly lager than a declination from time t5 to t6.

Then, the assumption is made that the engine completes start-up and the operation of the starter stops at time t7. At this moment, as shown in FIG. 9, voltage V1 rapidly recovers to a voltage before the voltage drop. Consequently, the same state as that from time t5 to t6 is entered, and as shown in FIG. 9, a small amount of current I1 flows again from power source 22. Following this, as shown in FIG. 9, current I5 supplied from auxiliary power supply 30 to load 21 becomes slightly lower at the negative side. Consequently, as shown in FIG. 9, the declination of voltage V3 of auxiliary power supply 30 decreases as well.

Voltage V3 of auxiliary power supply 30 needs to be preliminarily adjusted to a charge-target voltage as described above, and thus control circuit 76 changes selector switch 66 to the step-down position at time t8. With this operation, DC/DC converter 24 performs control so that voltage V3 of auxiliary power supply 30 becomes the charge-target voltage of set voltage source 64. Consequently, voltage V3 reaches the charge-target voltage at time t9 and then maintains the voltage.

When voltage V3 reaches the charge-target voltage, power supply from auxiliary power supply 30 to load 21 is stopped to maintain the voltage. Consequently, as shown in FIG. 9, load consumption current I2 is supplied from power source 22 to load 21 at time t9. At this moment, as shown in FIG. 9, power supply from auxiliary power supply 30 has been stopped, and thus current I5 at first I/O terminal 34 becomes zero.

Even if both a large current generating period and voltage drop period exist, by repeating the above-described operation, current I2 and voltage V2 to load 21 always retain almost the same values as shown in FIG. 9, and thus load 21 can continue its operation stably. Here, time t8 when selector switch 66 is changed may be any time between t7 and t9. Updating voltage V4 held is performed in the same way as in the first embodiment.

The above-described structure and operation implement power supply unit 20 in which the difference is always small between the voltage of power source 22 in normal times and the output voltage of DC/DC converter 24 when temporarily fluctuating due to generation of a large amount of current from power source 22 or a voltage drop at power source 22.

In the fourth embodiment, the description is made for the case where a large current generating period due to regeneration operation and a voltage drop period due to starter operation nearly continuously occur, as seen in stop idling function. However, the present invention is applicable to a case where both periods occur at a long time interval as well. In such a case, control has only to be performed so that voltage V3 of auxiliary power supply 30 always becomes a charge-target voltage when whichever period completes, a large current generating period or voltage drop period.

In the fourth embodiment as well, any storage element may be used as long as it is rapidly charging and discharging (e.g. electric double layer capacitor, electrochemical capacitor) as auxiliary power supply 30. However, for an electrochemical capacitor, its discharge potential cannot be made to 0 V, and thus the charge-target voltage of set voltage source 64 needs to be determined in consideration of the lowest possible voltage at which the electrochemical capacitor operates.

Fifth Exemplary Embodiment

Figure 10:
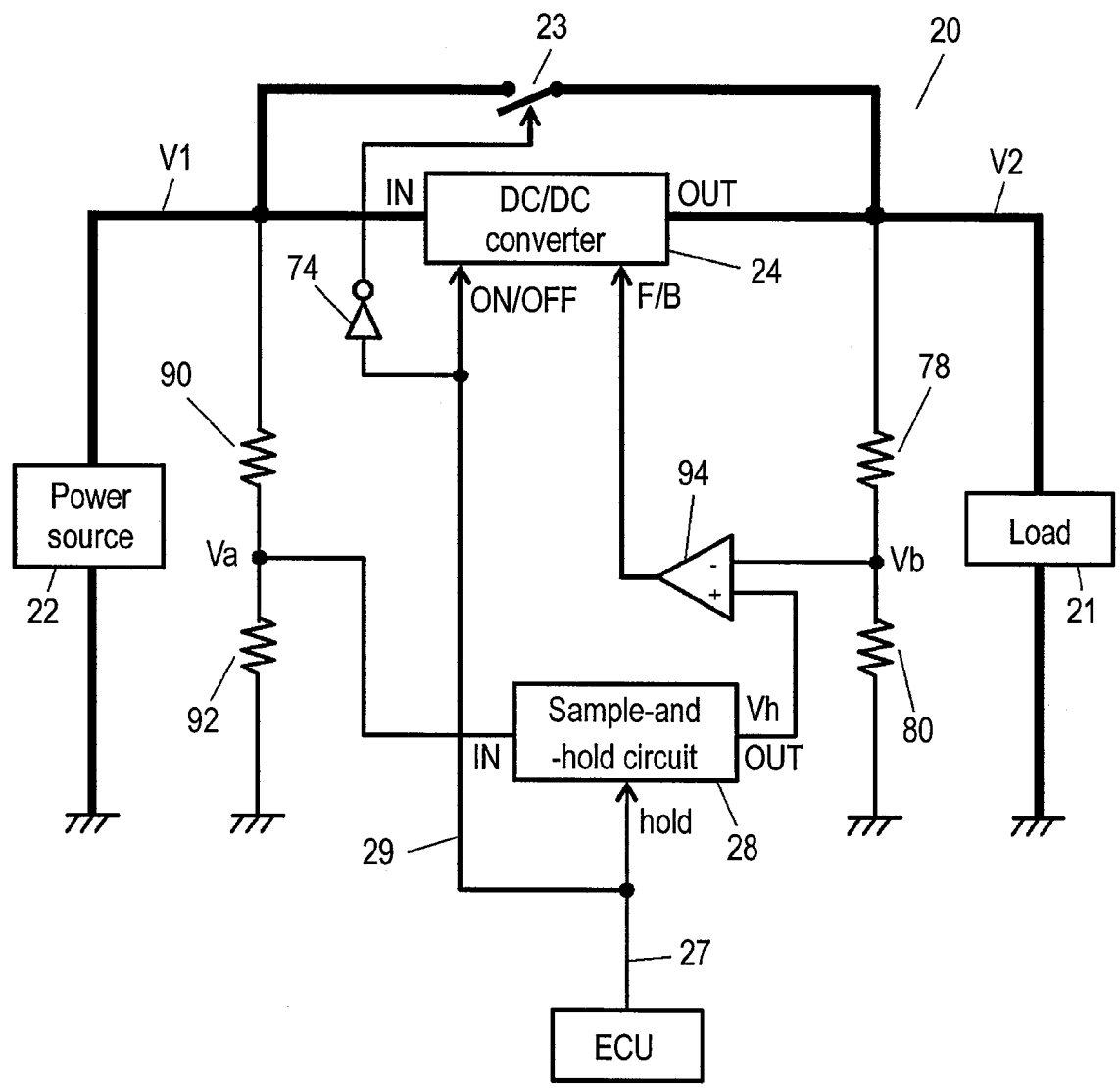
FIG. 10 is a block circuit diagram of a power supply unit according to the fifth embodiment of the present invention.
Figure 11:
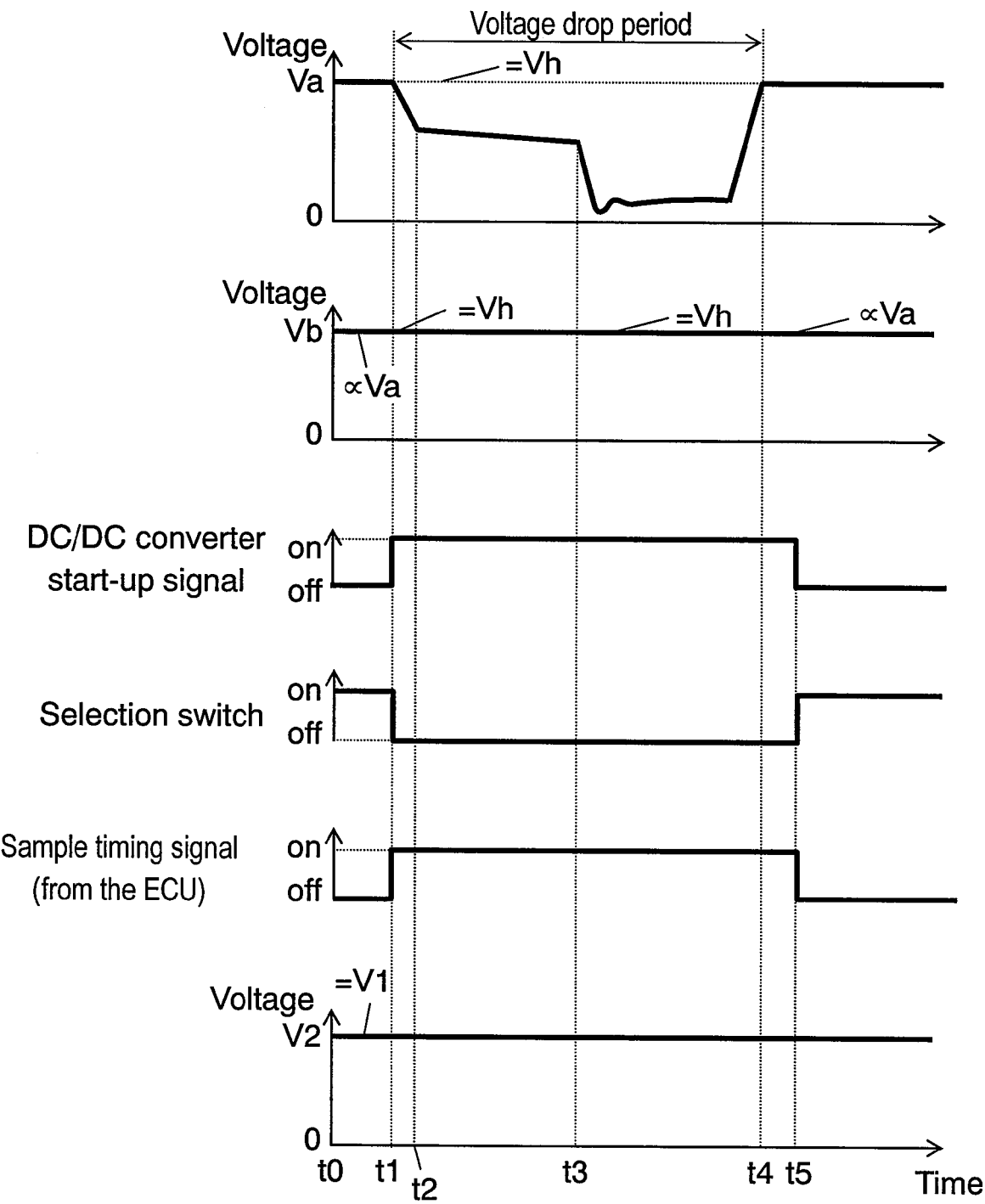
FIG. 11 is a timing diagram showing the operation of the power supply unit according to the fifth embodiment of the present invention.
Figure 12:
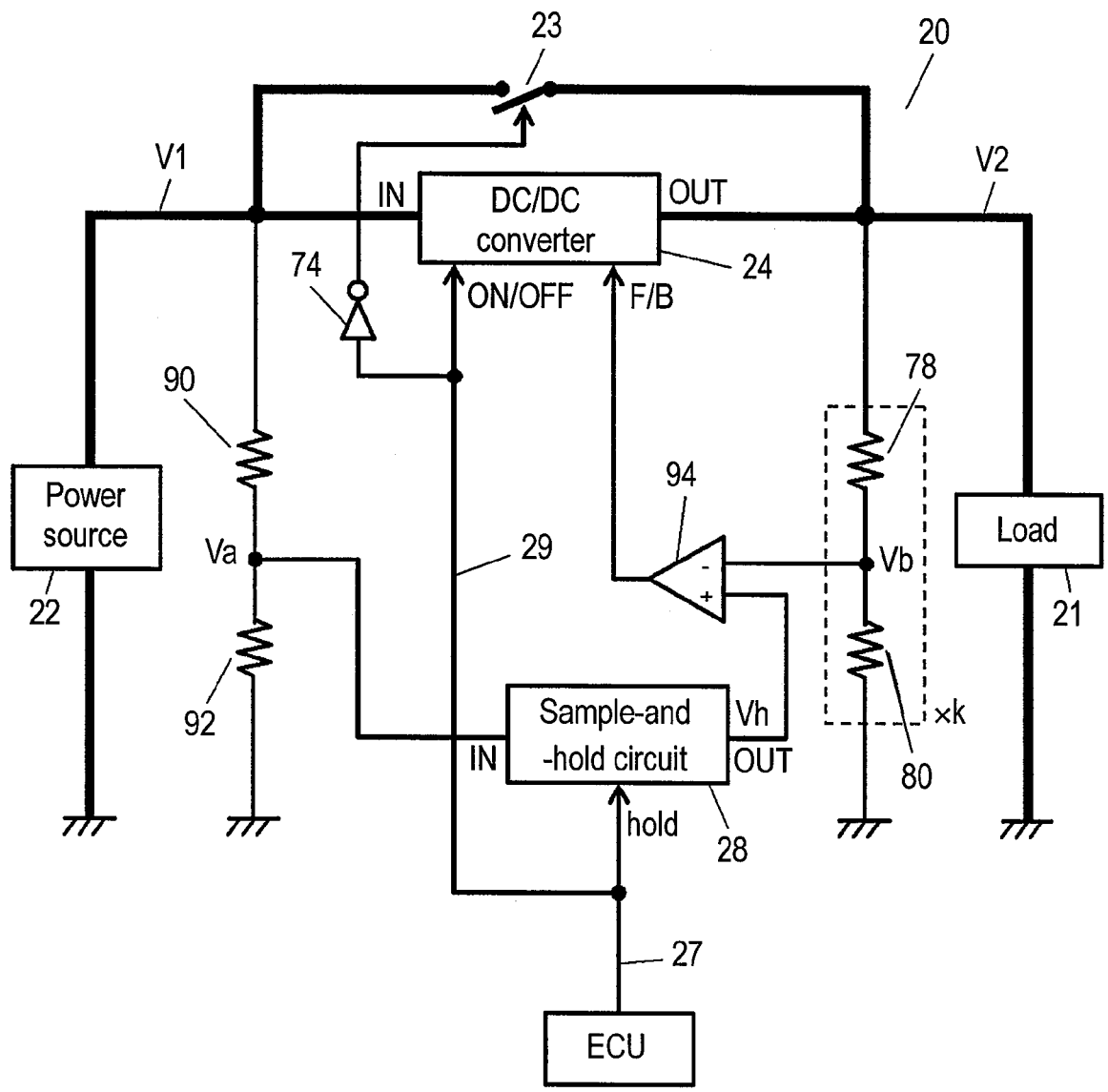
FIG. 12 is a block circuit diagram of a power supply unit with another structure, according to the fifth embodiment of the present invention.
Figure 13:
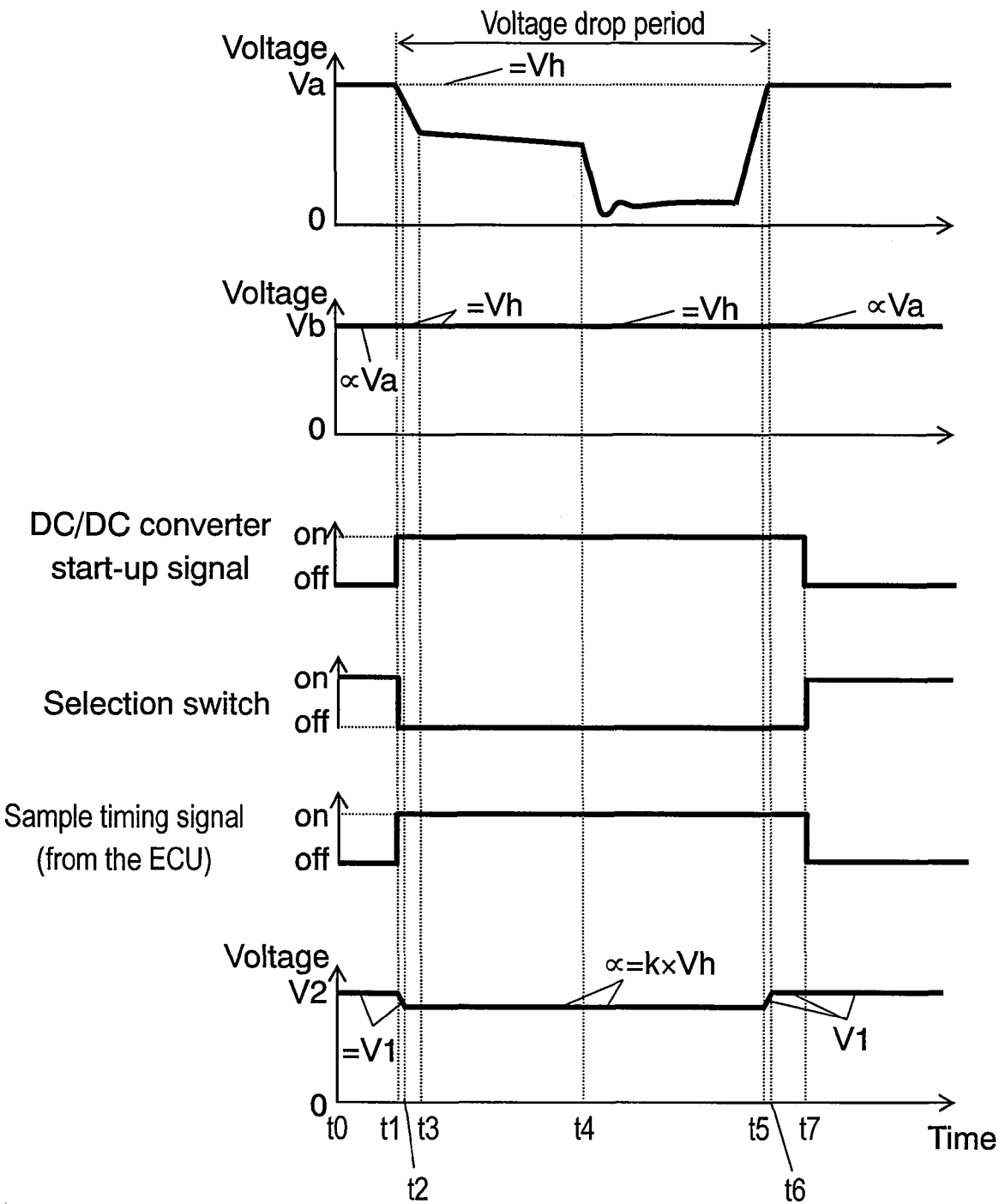
FIG. 13 is a timing diagram showing the operation of the power supply unit with another structure, according to the fifth embodiment of the present invention.

FIG. 10 is a block circuit diagram of a power supply unit according to the fifth embodiment of the present invention. FIG. 11 is a timing diagram showing the operation of the power supply unit according to the fifth embodiment of the present invention. FIG. 11 includes time-lapse change of voltage Va when voltage V1 of a power source is resistively divided with a resistance for detecting voltage V1, time-lapse change of voltage Vb when voltage V2 supplied to a load is resistively divided with resistors 78, 80 for detecting voltage V2, an on-off timing diagram of DC/DC converter start-up signal 29, an on-off timing diagram of a selection switch, an on-off timing diagram of sample timing signal 27, and time-lapse change of voltage V2 supplied to a load. FIG. 12 is a block circuit diagram of a power supply unit with another structure, according to the fifth embodiment of the present invention. FIG. 13 is a timing diagram showing the operation of the power supply unit with another structure, according to the fifth embodiment of the present invention. FIG. 13 includes time-lapse change of voltage Va when voltage V1 of a power source is resistively divided with a resistance for detecting voltage V1, time-lapse change of voltage Vb when voltage V2 supplied to a load is resistively divided with resistors 78, 80 for detecting voltage V2, an on-off timing diagram of DC/DC converter start-up signal 29, an on-off timing diagram of selection switch 23, an on-off timing diagram of sample timing signal 27, and time-lapse change of voltage V2 supplied to a load.

In FIGS. 10, 12, a component same as that in FIG. 4 is given the same reference mark to omit its detailed description. Heavy lines indicate wiring of the power system; thin lines, the control system. In the fifth embodiment, a description is made in the same way as in the second embodiment, in a vehicle with stop idling function, for example, for the structure in which, when voltage of a power source (composed of a battery and a generator) drops, the voltage of the power source is stepped up and its DC output is supplied to a load.

First, a description is made for the circuit configuration of FIG. 10. Power is supplied to load 21 through either of the following two paths as shown by the heavy lines in FIG. 10. One is a path through which power from power source 22 is directly supplied through selection switch 23, and the other, supplied through DC/DC converter 24. The fifth embodiment is structured so that selection switch 23 is on-off controllable according to an external signal, and is composed of an FET, for example.

Voltage V1 of power source 22 is detected as midpoint voltage Va when voltage V1 is resistively divided with resistors 90, 92 for detecting voltage V1. That is, assuming the resistances of resistors 90, 92 for detecting voltage V1 are R1 and R2, respectively, the equation Va=V1×R2/(R1+R2) holds, and thus voltage Va corresponds to voltage V1. This voltage Va is input through input terminal IN of sample-and-hold circuit 28.

In the same way, voltage V2 at load 21 is detected as midpoint voltage Vb when voltage V2 is resistively divided with resistors 78, 80 for detecting voltage V2. That is, assuming the resistances of resistors 78, 80 for detecting voltage V2 are R3 and R4, respectively, the equation Vb=V2×R4/(R3+R4) holds, and thus voltage Vb corresponds to voltage V2. This voltage Vb together with hold voltage Vh output from output terminal OUT of sample-and-hold circuit 28 is input to operational amplifier 94. Output from operational amplifier 94 is input to feedback terminal F/B of DC/DC converter 24.

Sample timing signal 27 delivered from the engine ECU is input to hold terminal "hold" of sample-and-hold circuit 28 and also to on-off terminal ON/OFF as a start-up signal for DC/DC converter 24. Further, sample timing signal 27 is inverted by inverting circuit 74 to perform on-off control of selection switch 23.

Here, the operation of sample-and-hold circuit 28 is different from those in the embodiments first through fourth. When hold terminal "hold" is off, voltage at input terminal IN is directly output from output terminal OUT. After that, when hold terminal "hold" is on, voltage at input terminal IN is held, and voltage Vh held always continues to be output from output terminal OUT. To update hold voltage Vh, hold terminal "hold" is turned off, and then turned on when desired.

Next, a description is made for the operation of power supply unit 20 with such a structure using FIG. 11. Here, the operation shown by the heavy dotted lines in FIG. 5, for example, is the same as that shown by the heavy solid lines V1(min) and V2(min) in FIG. 5 (merely the voltage becomes low), and is omitted in FIG. 11.

First, at time t0, stop idling is not performed and the engine is being driven. At this moment, since the generator is operating as well, voltage V1 of power source 22 is stable at approximately 14 V, for example. Consequently, voltage Va corresponding to voltage V1 is stable at a high voltage value as shown in FIG. 11. At this time, as shown in FIG. 11, since sample timing signal 27 from the ECU is off, DC/DC converter start-up signal 29 to be input to on-off terminal ON/OFF of DC/DC converter 24 remains off and DC/DC converter 24 is in a stopped state. Sample timing signal 27 is inverted by inverting circuit 74, and thus an on signal is input to selection switch 23 as shown in FIG. 11. Consequently, selection switch 23 turns on.

From these results, voltage V1 of power source 22 is directly supplied to load 21 because selection switch 23 is on. Consequently, as shown in FIG. 11, voltage Vb becomes voltage corresponding to voltage Va, and voltage V2 is equal to voltage V1.

Next, the assumption is made that stop idling is performed to stop the engine at time t1. The ECU delivers sample timing signal 27 at the time before the engine stops. In the fifth embodiment, sample timing signal 27 is a signal that turns on before the engine stops and remains on until the engine completes restart. Consequently, sample timing signal 27 is at least on state from the engine stops until the engine completes restart.

In the fifth embodiment, time t1 shows a case where sample timing signal 27 has been delivered nearly at the same time as the engine stops as shown in FIG. 11. Accordingly, as shown in FIG. 11, sample timing signal 27 is on at time t1. This turns on hold terminal "hold" of sample-and-hold circuit 28, and thus voltage Va corresponding to voltage V1 of power source 22 is held and the voltage value (hold voltage Vh) is output from output terminal OUT. Simultaneously with this, as shown in FIG. 11, DC/DC converter start-up signal 29 (equivalent to sample timing signal 27 in the fifth embodiment) turns on and is input to on-off terminal ON/OFF to start up DC/DC converter 24. Further, as shown in FIG. 11, as the on-off signal of selection switch 23 is an inverted start-up signal for DC/DC converter 24, the on-off signal becomes off. Resultingly, selection switch 23 is off.

In summary, when sample timing signal 27 turns on at a time before voltage V1 of power source 22 drops (here, time t1 when voltage V1 start to drops), voltage Va corresponding to voltage V1 of power source 22 is held by sample-and-hold circuit 28, DC/DC converter 24 is started up, and selection switch 23 is turned off. Here, sample timing signal 27 may be turned on at any time before voltage V1 drops. However, if sample timing signal 27 is turned on too early, voltage V1 cannot be held even if voltage V1 fluctuates before sample timing signal 27 is turned on, deteriorating the control accuracy of voltage V2 output from DC/DC converter 24, and thus sample timing signal 27 is desirably turned on immediately before voltage V1 drops to the extent as possible.

As a result of such operation, power is supplied from DC/DC converter 24 to load 21. DC/DC converter 24 controls output voltage V2 according to a feedback signal from operational amplifier 94 so that voltage Vb corresponding to voltage V2 output from DC/DC converter 24 becomes voltage Vh held by sample-and-hold circuit 28. Consequently, as shown by the time-lapse change of Va in FIG. 11, even if a voltage drop at power source 22 occurs due to a stop of the generator, voltage Vb corresponding to output voltage V2 becomes equal to hold voltage Vh as shown in the time-lapse change of Vb in FIG. 11, which does not cause a voltage drop. Consequently, as shown by time-lapse change of V2 in FIG. 11, voltage V2 remains equal to voltage V1 after time t1, thereby continuously supplying load 21 with power at stable voltage.

During the period from time t1 (stop idling occurs) to time t2 (after a short period elapses), as shown in FIG. 11, voltage Va corresponding to voltage V1 of power source 22 drops rapidly, however, it decreases slowly after time t2. Meanwhile, despite such fluctuation of voltage Va, as shown in FIG. 11, voltage Vb corresponding to voltage V2 output from DC/DC converter 24 remains stable at hold voltage Vh, and thus voltage V2 maintains a state equal to voltage V1 when held.

Next, the assumption is made that stop idling ends and the starter is driven to restart the engine at time t3. In this case, since a large amount of current flows through the starter, voltage V1 of power source 22 rapidly drops to approximately 6V. Consequently, as shown by the time-lapse change of Va in FIG. 11, voltage Va corresponding to voltage V1 also drops rapidly. After that, as the engine revolution becomes stabilized, an amount of current to the starter decreases to increase voltage Va. When the engine completes restart at time t4, the generator restarts as well, and thus voltage V1 of power source 22 returns to a voltage value (approximately 14 V) before the stop idling. Consequently, voltage Va corresponding to voltage V1 recovers the voltage value from time t0 to t1.

However, in the fifth embodiment, as shown in FIG. 11, sample timing signal 27 remains on at time t4, and thus, as shown in FIG. 11, DC/DC converter start-up signal 29 is on and continues its operation. Selection switch 23 remains off as shown in FIG. 11. Consequently, even if voltage Va has recovered at time t4, output from DC/DC converter 24 continues to be supplied to load 21.

After that, the assumption is made that sample timing signal 27 from the ECU turns off at time t5 after the time point (time t4) when the engine restarted as shown in FIG. 11. The operation in this case is opposite to that at time t1, namely hold terminal "hold" of sample-and-hold circuit 28 turns off, and thus hold voltage Vh at output terminal OUT of sample-and-hold circuit 28 becomes equal to voltage Va at input terminal IN. As shown in FIG. 11, start-up signal 29 for DC/DC converter 24 turns off to stop the operation. Further, as shown in FIG. 11, selection switch 23 turns on, and thus voltage V1 of power source 22 is to be applied to load 21 through selection switch 23. With this operation, the state returns to a state when the engine is in operation, namely the state at time t0.

With such operation, DC/DC converter 24 operates to continue supplying load 21 with voltage corresponding to hold voltage Vh during the voltage drop period (time t1 to t4) of voltage Va shown in FIG. 11, and thus V2 is stable as shown in FIG. 11 even if voltage V1 of power source 22 largely fluctuates. Consequently, load 21 can continue to be driven.

In the fifth embodiment, sample timing signal 27 is off at time t5 after time t4 when the engine completes restart. However, sample timing signal 27 may become off at time t4. In this case, the operating time of DC/DC converter 24 is decreased, thereby reducing power consumption.

To summarize the operation when the engine restarts described above, as shown in FIG. 11, when sample timing signal 27 turns off after the time point (time t4) when voltage Va corresponding to voltage V1 of power source 22 recovers to hold voltage Vh, DC/DC converter 24 is to be stopped and selection switch 23 is to be turned on.

In the circuit configuration of FIG. 10, as shown in FIG. 11 (from time t4 to t5), DC/DC converter 24 continues its operation even after voltage V1 of power source 22 has recovered to the level before stop idling, where voltage (target control voltage) that DC/DC converter 24 is going to output is nearly equal to voltage V1. Consequently, as voltage V2 output from DC/DC converter 24 becomes equal to voltage V1, intermittent operation performed, which causes a voltage ripple in output from DC/DC converter 24 during the period from t4 to t5.

If this voltage ripple is problematic, power supply unit 20 may have a circuit configuration shown in FIG. 12. The structure of FIG. 12 is different from that of FIG. 10 in that the resistances of resistors 78, 80 for detecting voltage V2 are set so that voltage V2 output from DC/DC converter 24 is a predetermined constant times (k times) lower than voltage V1 of power source 22 when held. More specifically, assuming the resistances of resistors 90, 92 for detecting voltage V1 are R1 and R2, respectively, and those of resistors 78, 80 for detecting voltage V2 are R3 and R4, respectively, R3 and R4 are set so that R2/(R1+R2)=k×R4/(R3+R4). Here, to make voltage V2 lower than voltage V1 (target control voltage) when held, k is a positive numeric value less than 1. In the fifth embodiment, in the same way as in the first embodiment, k=0.9 so that voltage V2 is 10% lower than voltage V1 when held.

Time-lapse change of voltage V2 output from DC/DC converter 24 with such a structure is shown in FIG. 13. Here, FIG. 13 is completely the same as FIG. 11 except voltage V2, and thus its description is omitted.

As shown at time t1 in FIG. 13, when sample timing signal 27 is delivered from the ECU, DC/DC converter 24 turns on and selection switch 23 turns off. With this operation, voltage V2 output from DC/DC converter 24 is applied to load 21. In this case, control is performed so that the target control voltage of DC/DC converter 24 becomes a voltage that is k times voltage V1 of power source 22 held at time t1. Consequently, voltage V1 is higher than the target control voltage (=k× V1=0.9×V1) at time t1. Accordingly, DC/DC converter 24, a step-up converter as described above, does not undergo step-up operation even if started up, and thus voltage V1 at input terminal IN is almost directly output from output terminal OUT.

After that, as shown in FIG. 13, since voltage Va corresponding to voltage V1 decreases after stop idling is started, where, when voltage V1 becomes the target control voltage at time t2, the voltage value (∝k×Vh) is output, and after t2, the voltage proportional to k×Vh is maintained.

After that, as a result that stop idling ends and voltage V1 of power source 22 recovers, when voltage V1 exceeds the target control voltage at time t5, DC/DC converter 24 almost directly outputs voltage V1 at input terminal IN from output terminal OUT as described above. Consequently, voltage V2 increases in the same way as voltage V1 during the period from time t5 to time t6 when voltage V1 completes its recovery, and then voltage V1 becomes stabilized after time t6, so does voltage V2.

After that, as shown in FIG. 13, when sample timing signal 27 turns off at time t7, DC/DC converter 24 turns off, and simultaneously selection switch 23 turns on. With this operation, voltage V1 is directly applied to load 21, and thus voltage V2 becomes equal to voltage V1.

In such operation, DC/DC converter 24 continues its operation from time t6 to t7 even if voltage V1 has been recovered. However, the target control voltage is k times lower than voltage V1 after recovery, and thus DC/DC converter 24 does not perform unstable intermittent operation, unlike in the structure of FIG. 10. Accordingly, stable voltage V2 with a voltage ripple hardly occurring can continue to be output.

The above-described structure and operation implement power supply unit 20 in which the difference is always small between the voltage of power source 22 in normal times and the output voltage of DC/DC converter 24 when temporarily fluctuating due to a voltage drop at power source 22.

Sixth Exemplary Embodiment

Figure 14:
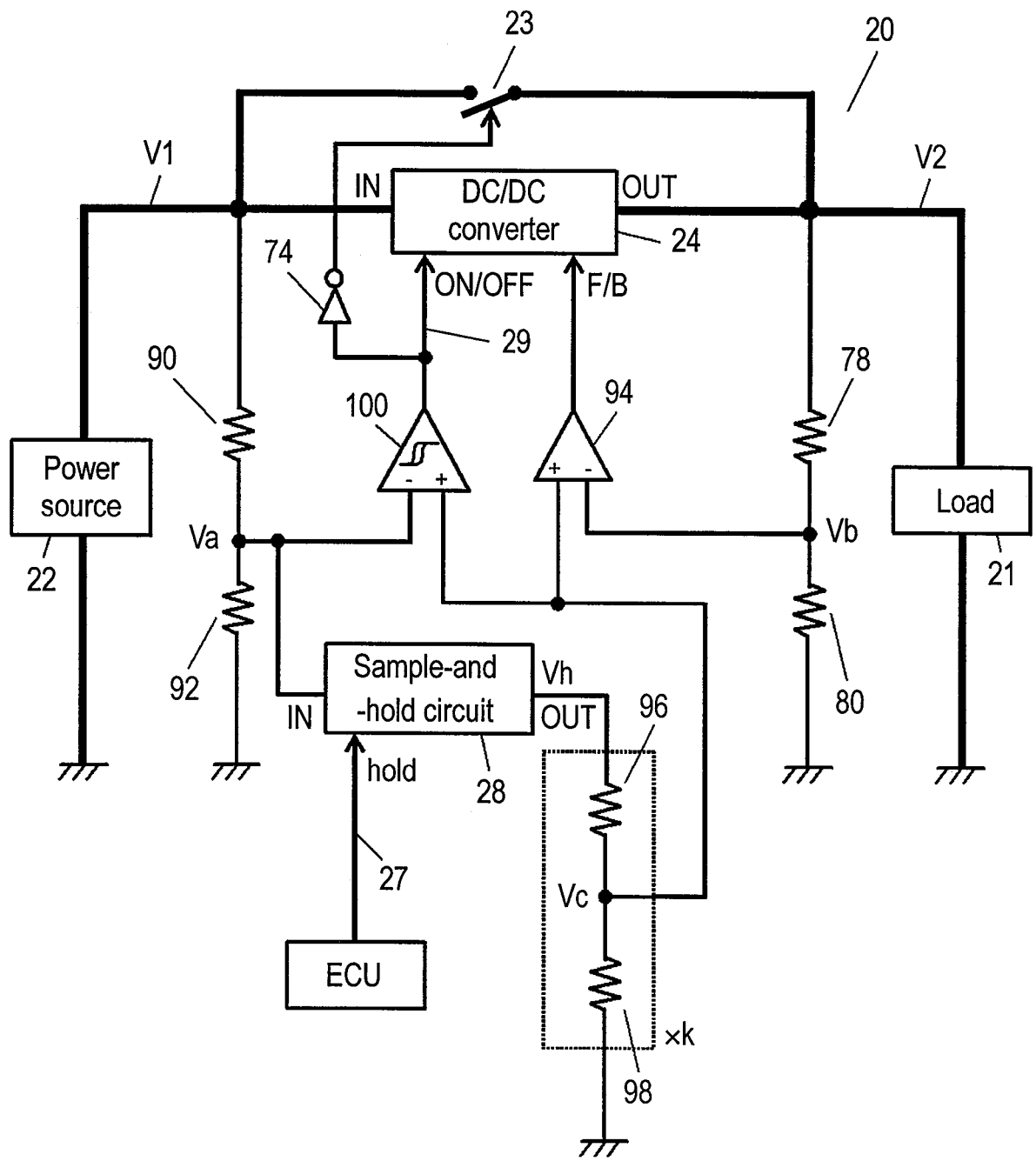
FIG. 14 is a block circuit diagram of a power supply unit according to the sixth embodiment of the present invention.
Figure 15:
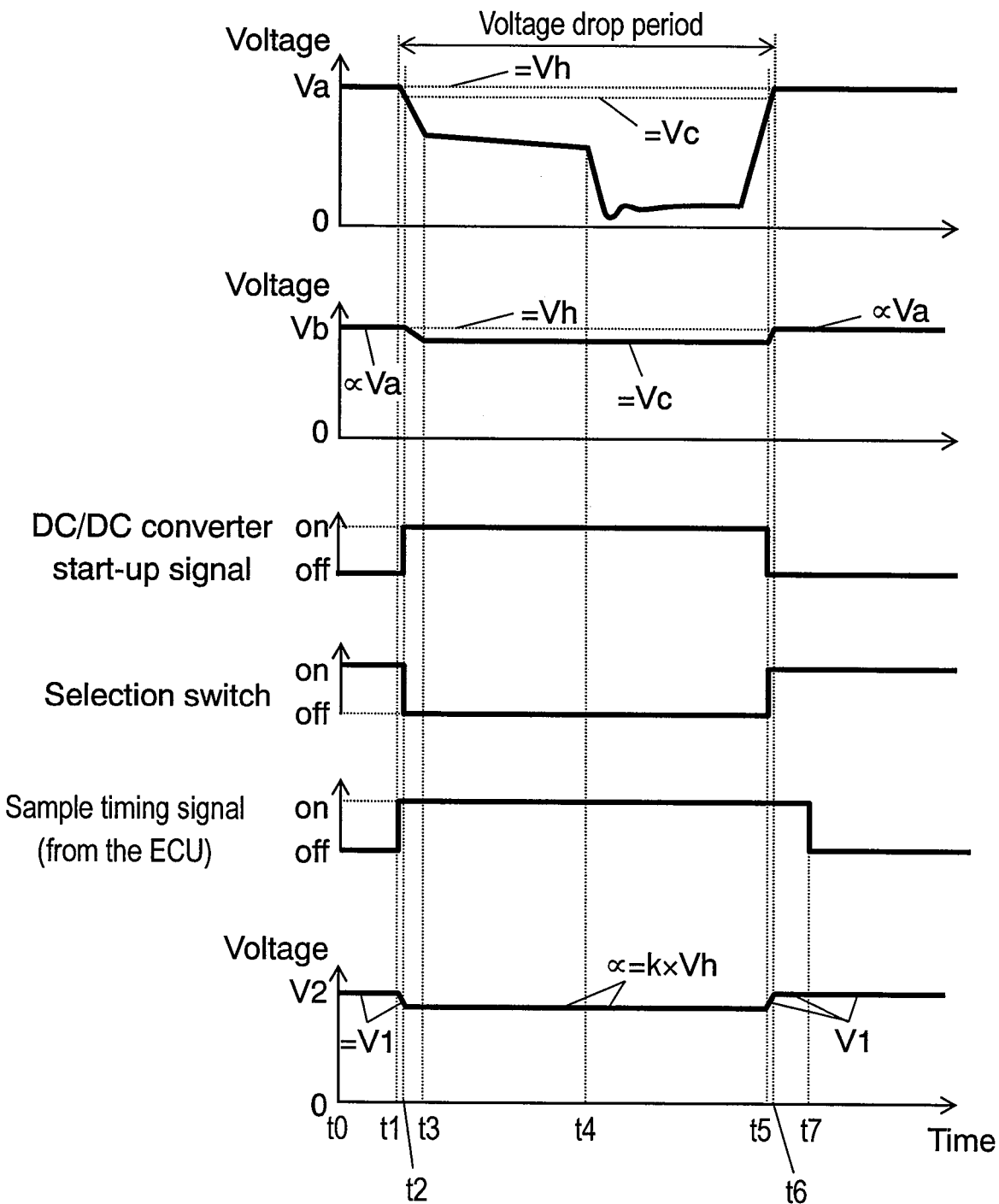
FIG. 15 is a timing diagram showing the operation of the power supply unit according to the sixth embodiment of the present invention.
Figure 16:
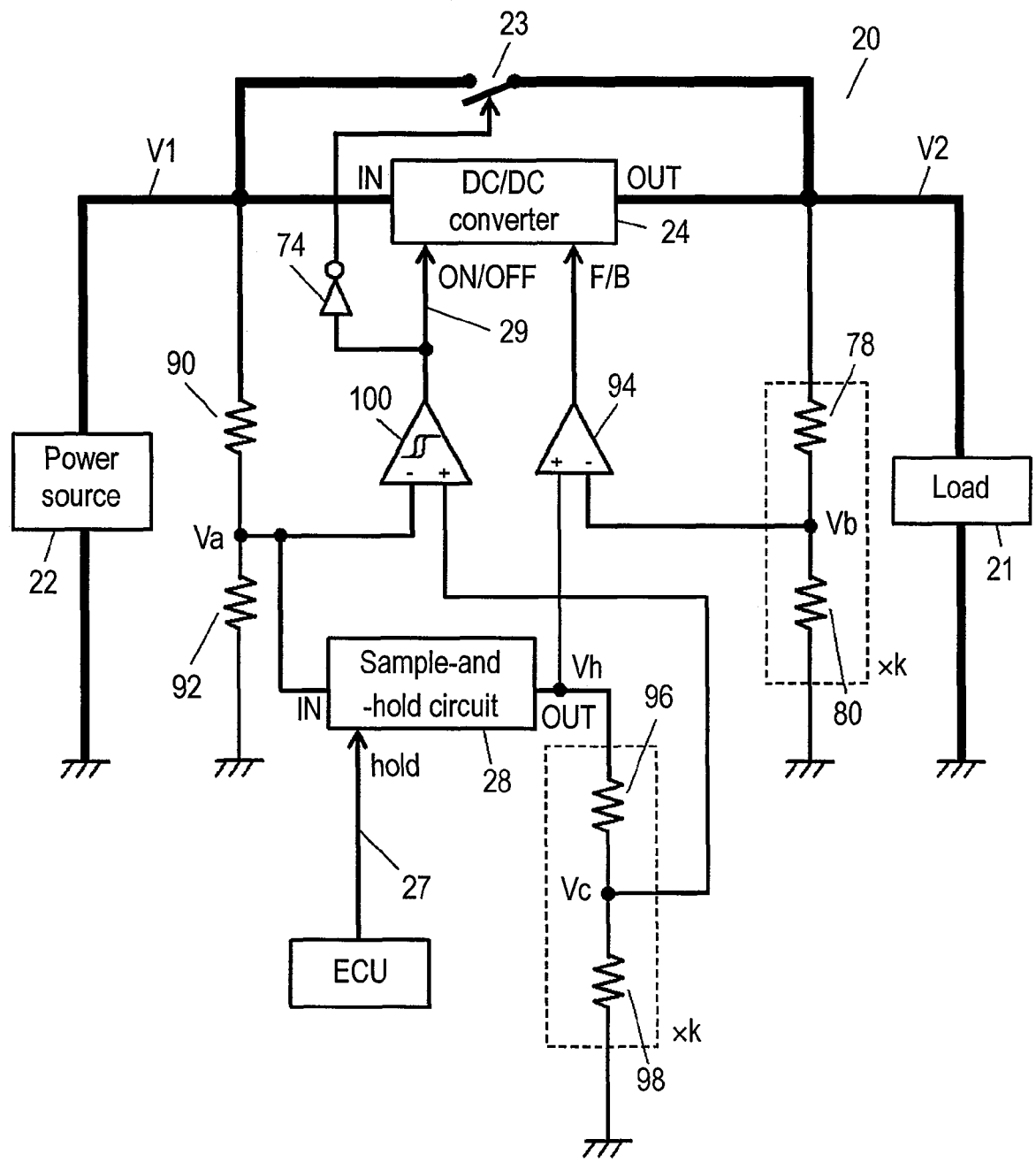
FIG. 16 is a block circuit diagram of a power supply unit with another structure, according to the sixth embodiment of the present invention.
Figure 17:
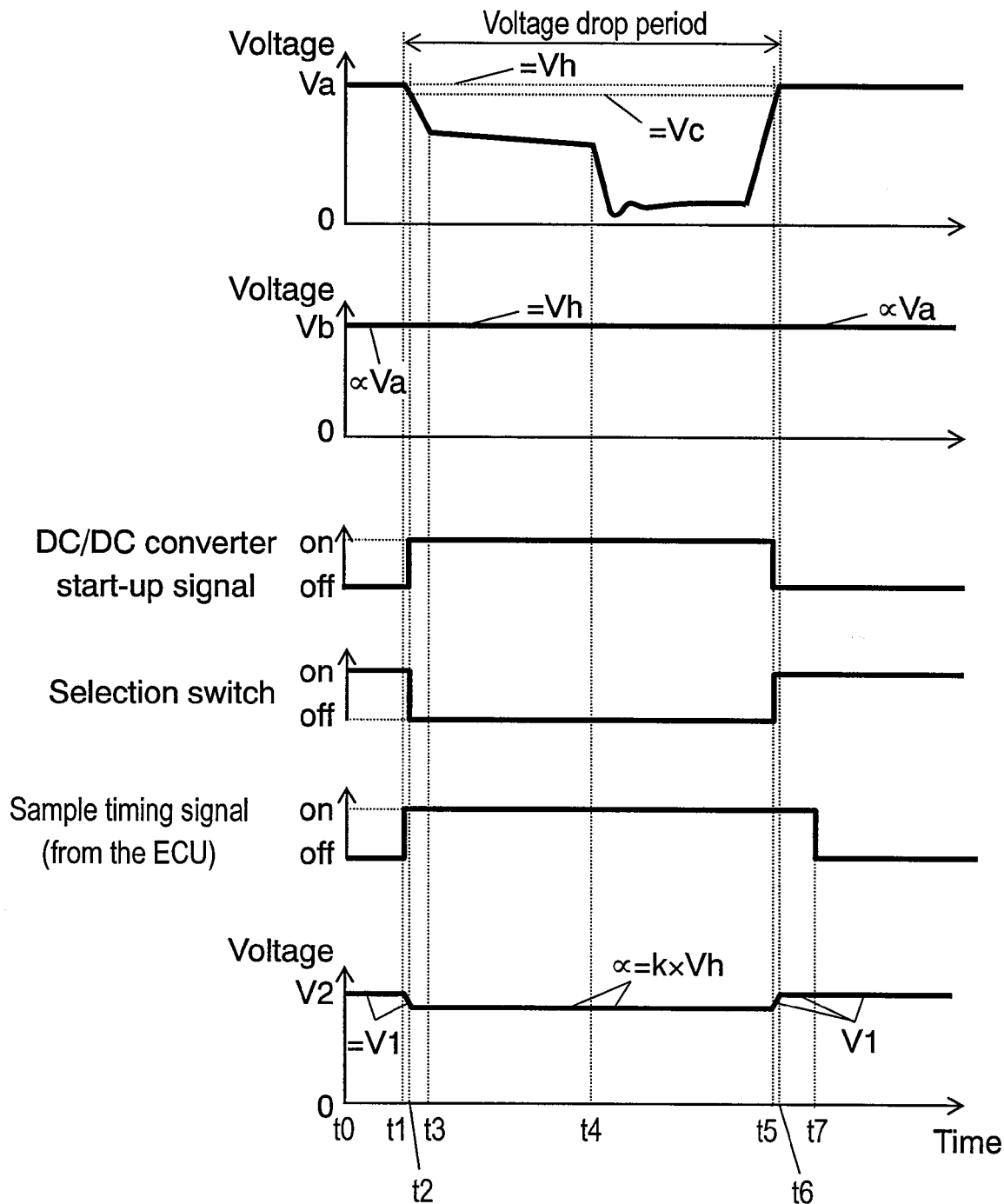
FIG. 17 is a timing diagram showing the operation of the power supply unit with another structure, according to the sixth embodiment of the present invention.
Figure 18:
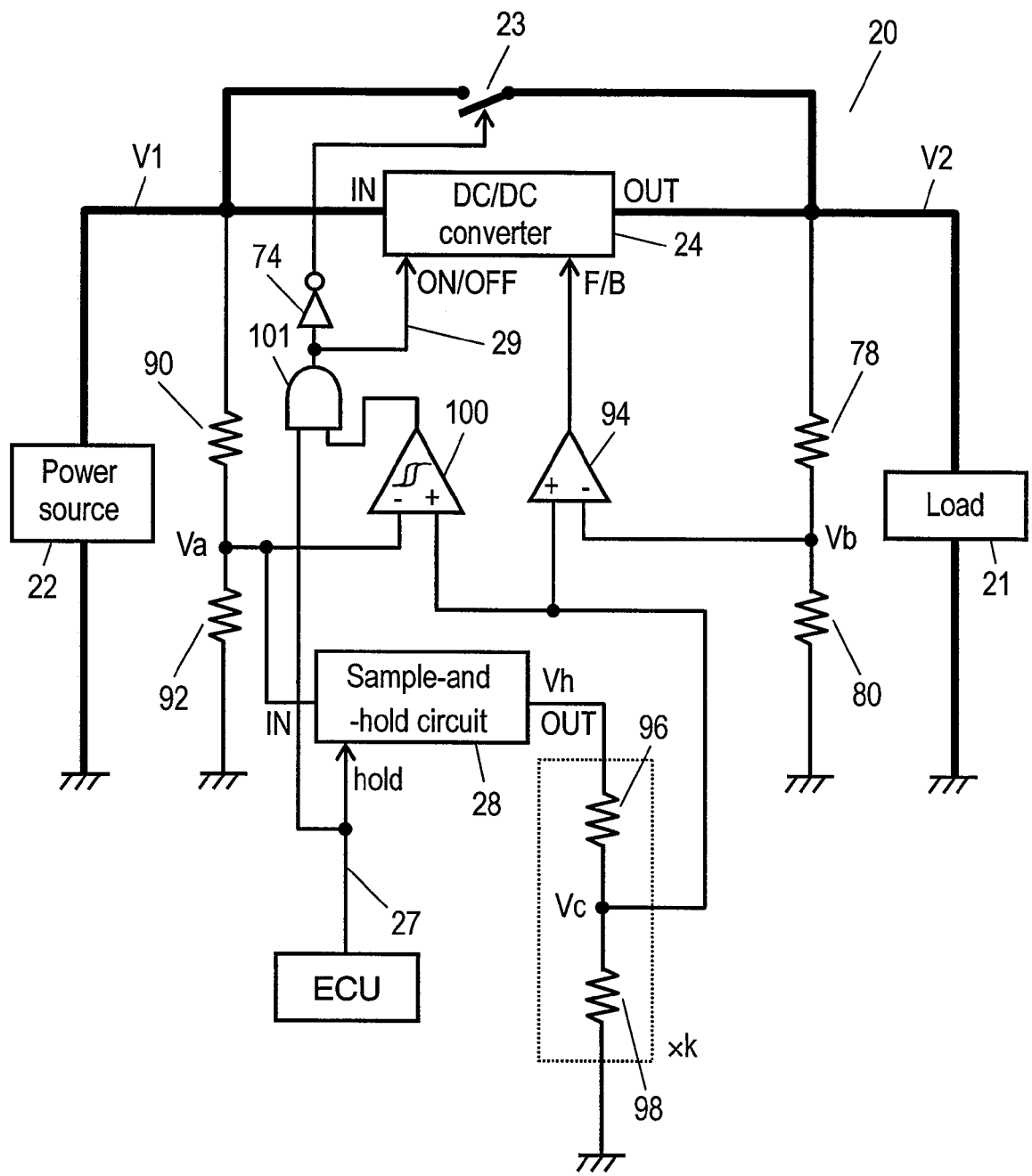
FIG. 18 is a block circuit diagram of a power supply unit with yet another structure, according to the sixth embodiment of the present invention.
Figure 19:
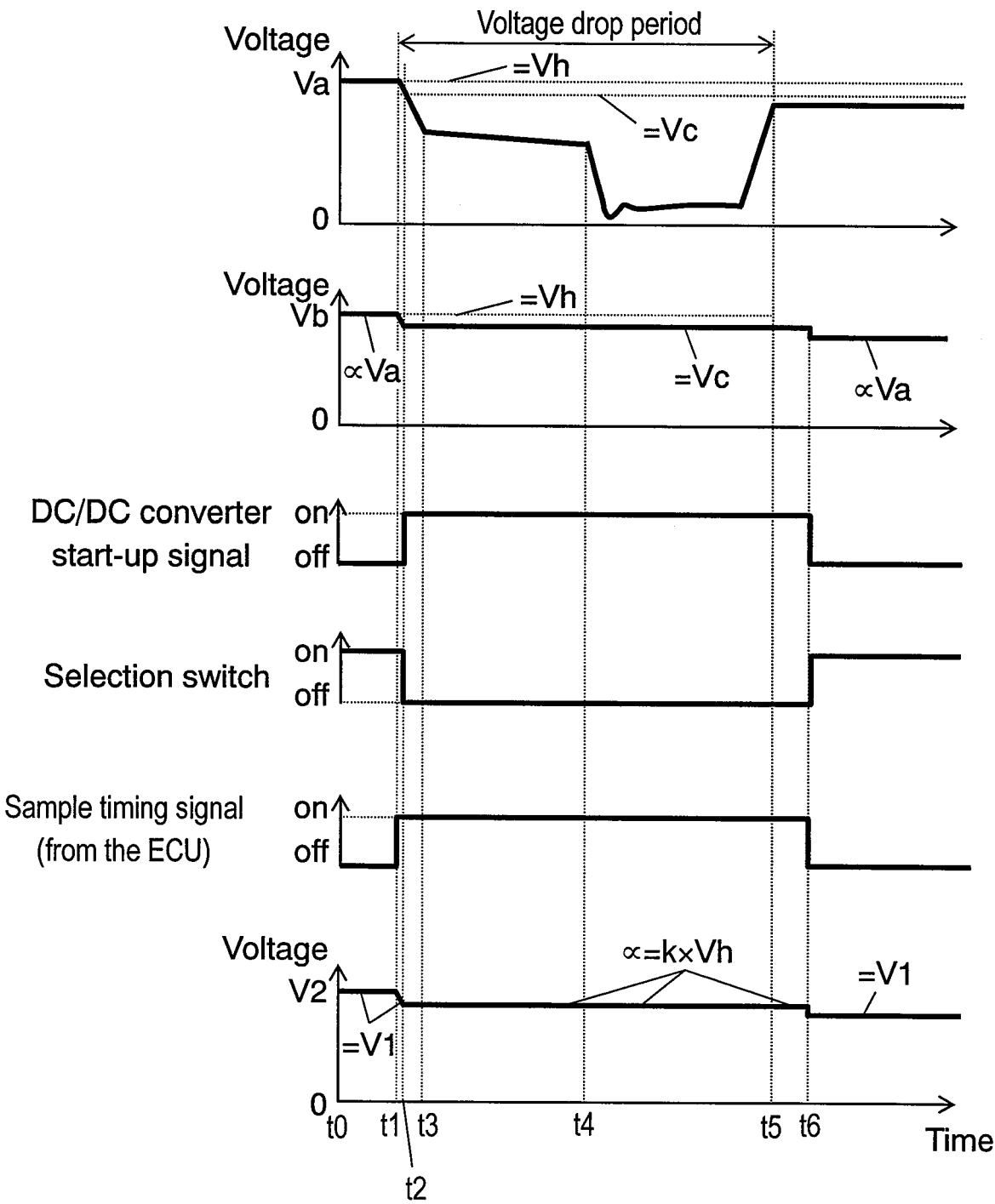
FIG. 19 is a timing diagram showing the operation of the power supply unit with yet another structure, according to the sixth embodiment of the present invention.

FIG. 14 is a block circuit diagram of a power supply unit according to the sixth embodiment of the present invention. FIG. 15 is a timing diagram showing the operation of the power supply unit according to the sixth embodiment of the present invention. FIG. 15 includes time-lapse change of voltage Va when voltage V1 of power source is resistively divided with a resistance for detecting voltage V1, time-lapse change of voltage Vb when voltage V2 supplied to a load is resistively divided with resistors 78, 80 for detecting voltage V2, an on-off timing diagram of DC/DC converter start-up signal 29, an on-off timing diagram of a selection switch, an on-off timing diagram of sample timing signal 27, and time-lapse change of voltage V2 supplied to a load. FIG. 16 is a block circuit diagram of a power supply unit with another structure, according to the sixth embodiment of the present invention. FIG. 17 is a timing diagram showing the operation of the power supply unit with another structure, according to the sixth embodiment of the present invention. FIG. 17 includes time-lapse change of voltage Va when voltage V1 of a power source is resistively divided with a resistance for detecting voltage V1, time-lapse change of voltage Vb when voltage V2 supplied to a load is resistively divided with a resistance for detecting voltage V2, an on-off timing diagram of DC/DC converter start-up signal 29, an on-off timing diagram of a selection switch, an on-off timing diagram of sample timing signal 27, and time-lapse change of voltage V2 supplied to a load. FIG. 18 is a block circuit diagram of a power supply unit with yet another structure, according to the sixth embodiment of the present invention. FIG. 19 is a timing diagram showing the operation of the power supply unit with yet another structure, according to the sixth embodiment of the present invention. FIG. 19 includes time-lapse change of voltage Va when voltage V1 of a power source is resistively divided with a resistors for detecting voltage V1, time-lapse change of voltage Vb when voltage V2 supplied to a load is resistively divided with resistors 78, 80 for detecting voltage V2, an on-off timing diagram of DC/DC converter start-up signal 29, an on-off timing diagram of a selection switch, an on-off timing diagram of sample timing signal 27, and time-lapse change of voltage V2 supplied to the load.

In FIGS. 14, 16, 18, a component same as that in FIG. 10 is given the same reference mark to omit its detailed description. Heavy lines indicate wiring of the power system, and thin lines, the control system. In FIGS. 15, 17, 19, description for the operation shown by heavy dotted lines in FIG. 5 and others are omitted in the same way as in FIG. 11. In the sixth embodiment, a description is made in the same way as in the second embodiment, in a vehicle with stop idling function, for example, for the structure in which, when voltage of a power source (composed of a battery and a power generator) drops, the voltage is stepped up and its DC output is supplied to a load.

First, the circuit configuration of FIG. 14 is described. Compared with the structure of FIG. 10, the structural features of FIG. 14 are (1) through (3) below.

(1) Resistors 96, 98 for multiplying voltage Vh by a constant are connected to output terminal OUT of sample-and-hold circuit 28, and its midpoint voltage Vc (referred to as "threshold voltage Vc" hereinafter) is connected to operational amplifier 94 and the non-inverting input of hysteresis comparator 100. Here, resistances R5, R6 are set so that threshold voltage Vc is positive and lower than hold voltage Vh, namely k<1. In the sixth embodiment, like in the first embodiment, k is determined as k=0.9 so that threshold voltage Vc is 10% lower than hold voltage Vh, and thus Vc=Vh×R6/(R5+R6) =0.9×Vh.

(2) Voltage Va is input to the inverting input of hysteresis comparator 100.

(3) Output of hysteresis comparator 100 is used as a start-up signal for DC/DC converter 24 and connected to on-off terminal ON/OFF and inverting circuit 74.

(4) Following (3), sample timing signal 27 is only connected to terminal "hold" of sample-and-hold circuit 28.

Here, the reason why threshold voltage Vc is set so as to be lower than hold voltage Vh is to avoid a voltage ripple generated by DC/DC converter 24 intermittently operating. As described in the fifth embodiment, the voltage ripple occurs when input voltage V1 of DC/DC converter 24 becomes equal to output voltage V2. That is, with Vh>Vc, DC/DC converter 24 does not enter the state of V1=V2, causing no voltage ripple, thereby supplying load 21 with more stable voltage.

Next, a description is made for the operation of such power supply unit 20 referring to FIG. 15. First, the operation from time t0 to t1 is the same as that in the fifth embodiment, and thus its description is omitted.

The assumption is made that stop idling is performed to turn on sample timing signal 27 from the ECU at time t1. Consequently, sample-and-hold circuit 28 holds voltage Va corresponding to voltage V1 of power source 22. With this operation, threshold voltage Vc that is a hold voltage Vh multiplied by k with resistors 96, 98 for multiplying voltage Vh by a constant is input to operational amplifier 94 and hysteresis comparator 100. As a result, output from operational amplifier 94 is input to feedback terminal F/B of DC/DC converter 24 as a feedback signal for making voltage Vb to be threshold voltage Vc. Hysteresis comparator 100 compares voltage Va with threshold voltage Vc to output a Lo level ("off signal" hereinafter) if Va>Vc, and a Hi level ("on signal" hereinafter) if Va<Vc. At time t1, which is immediately after voltage Va is held and k=0.9, thus Va>Vc as shown in FIG. 15. Consequently, output from hysteresis comparator 100 is an off signal, and thus DC/DC converter start-up signal 29 remains off as shown in FIG. 15. Accordingly, DC/DC converter 24 remains stopping at time t1. In the same way, an off signal of hysteresis comparator 100 is inverted by inverting circuit 74, and thus selection switch 23 remains on at time t1 as shown in FIG. 15.

As described in the fifth embodiment, after time t1 when a stop idling state is entered, voltage V1 of power source 22 drops, and thus voltage Va corresponding to voltage V1 also decreases as shown in FIG. 15. Following this state, since selection switch 23 is on, voltage V2 applied to load 21 also decreases as shown in FIG. 15.

Meanwhile, hold voltage Vh is constant, and so is threshold voltage Vc. Consequently, voltage Va becomes lower than threshold voltage Vc. At time t2 when such a state begins, hysteresis comparator 100 outputs an on signal. Since this signal is DC/DC converter start-up signal 29, as shown in FIG. 15, DC/DC converter start-up signal 29 turns on to start operation and selection switch 23 turns off. With this state, power is to be supplied from DC/DC converter 24 to load 21 after time t2. Control is performed so that voltage Vb corresponding to output voltage V2 at this moment becomes threshold voltage Vc as shown in FIG. 15, and thus voltage lower than hold voltage Vh, namely voltage 10% lower than that before stop idling, is to be supplied to load 21. Consequently, as shown in FIG. 15, voltage V2 at load 21 is proportional to k×Vh (=Vc).

To summarize such operation, when sample timing signal 27 turns on at a time point before voltage V1 of power source 22 drops (here, time t1 when voltage V1 begins to drops), voltage Va corresponding to voltage V1 of power source 22 is held by sample-and-hold circuit 28, and when voltage Va corresponding to voltage V1 of power source 22 decreases to positive threshold voltage Vc that is a predetermined constant times (in the sixth embodiment, predetermined constant k=0.9) lower than hold voltage Vh, DC/DC converter 24 is to be started up and selection switch 23 is to be turned off. With this operation, voltage V2 output from DC/DC converter 24 becomes a predetermined constant times (k times) lower than voltage V1 of power source 22 when held. Here, sample timing signal 27 may be turned on at any time before voltage V1 drops, where desirably immediately before voltage V1 drops as possible.

After that, operations at time t3 and t4 are the same as those at time t2 and t3 in FIG. 11, respectively, and thus their description is omitted. Next, at time t5, the engine is assumed to be in a state immediately before restart completes. At this moment, as shown in FIG. 15, voltage Va rapidly rises, and thus becomes higher than threshold voltage Vc, making hysteresis comparator 100 output an off signal. Consequently, as shown in FIG. 15, a start-up signal for DC/DC converter 24 turns off to stop operation and selection switch 23 turns on. With this state, power is to be supplied to load 21 through selection switch 23 after time t5. Consequently, as shown in FIG. 15, voltage V2 becomes equal to voltage V1 and rises in the same way as voltage V1.

After time t5, voltage V1 of power source 22 is to be supplied to load 21, and thus voltage Vb corresponding to voltage V2 at load 21 also rises until time t6 when the engine fully completes restart as shown in FIG. 15. After that, when the engine completes restart at time t6 and voltage V1 of power source 22 becomes stabilized at approximately 14 V, voltage V2 and voltage Vb corresponding to it also become stabilized as shown in FIG. 15.

After that, sample timing signal 27 turns off at time t7 after the engine completes restart as shown in FIG. 15. However, since the operation of DC/DC converter 24 has been already stopped at this moment, voltage V2 and Vb corresponding to it remain unchanged as shown in FIG. 15.

To summarize such operation when the engine restarts, when voltage Va corresponding to voltage V1 of power source 22 recovers to threshold voltage Vc or higher, DC/DC converter 24 is to be stopped and selection switch 23 is to be turned on. With this operation, the state after time t6 results in having returned to the state at time t0.

With the above-described operation, during the voltage drop period (from time t1 to t6) shown in FIG. 15, from time t2 to t5, DC/DC converter 24 operates to continue supplying load 21 with voltage corresponding to threshold voltage Vc, from time t1 to t2 and from time t5 to t6, a voltage value corresponding to a voltage between hold voltage Vh and threshold voltage Vc is supplied. Consequently, as shown in FIG. 15, stable voltage V2 continues to be output even if voltage V1 of power source 22 largely fluctuates, thereby continuing to drive load 21.

In the sixth embodiment, sample timing signal 27 turns off at time t7, namely after time t6 when the engine completes restart. However, it may turn off at time t6.

With the operation of the sixth embodiment, rather than of the fifth embodiment, operating time of DC/DC converter 24 can be shortened to the minimum necessary. This brings about the advantage in that power consumption of power supply unit 20 is suppressed.

In the circuit configuration of FIG. 14, by setting threshold voltage Vc (=hold voltage Vh×k) to the target control voltage, voltage V2 output from DC/DC converter 24 is made a predetermined constant times (k times) lower than voltage V1 of power source 22 when held. However, the structure of FIG. 12 described in the fifth embodiment may be applied to that of FIG. 14. The circuit configuration in this case is shown in FIG. 16. The structure of FIG. 16 is different from that of FIG. 14 in that resistances R3, R4 of resistors 78, 80 for detecting voltage V2 are set so that R2/(R1+R2)=k×R4/(R3+R4) holds, and in that hold voltage Vh, not threshold voltage Vc, is connected to the non-inverting input of operational amplifier 94.

The operation of such power supply unit 20 is shown in FIG. 17. Compared to FIG. 15, the only different operation is the behavior of voltage Vb during the voltage drop period (time t1 to t6). That is, hold voltage Vh is input to the non-inverting input of operational amplifier 94, and thus in FIG. 17, control is performed so that voltage Vb becomes hold voltage Vh in the voltage drop period. Accordingly, the time-lapse change characteristic of Vb in FIG. 17 is the same as that of Vb in FIG. 13. Consequently, final output voltage V2 in the voltage drop period is equal to that in FIG. 13, which is also equal to that in FIG. 15 as well. Eventually, the structure of FIG. 16, in the same way as that in FIG. 14, brings about the advantage in that stable voltage V2 continues to be output independently of the fluctuation of voltage V1 of power source 22. Therefore, whichever structure (FIG. 14, FIG. 16) may be used.

The structure of FIG. 14 is applicable to the case where voltage V1 of power source 22 returns to a level nearly close to the voltage before stop idling when the engine completes restart after stop idling. However, if voltage V1 returns to a level lower than the voltage before stop idling when the engine completes restart, output from hysteresis comparator 100 does not turn off, resulting in DC/DC converter 24 continuing to operate.

Under the circumstances, a circuit configuration for avoiding such a state is shown in FIG. 18. The structure of FIG. 18 is different from that of FIG. 14 in that AND circuit 101 is provided into which output from hysteresis comparator 100 and sample timing signal 27 are respectively input, and that output from AND circuit 101 is connected to on-off terminal ON/OFF of DC/DC converter 24 and inverting circuit 74. With such structure, when voltage Va corresponding to voltage V1 of power source 22 recovers to a level higher than threshold voltage Vc or when sample timing signal 27 turns off, DC/DC converter 24 can be stopped. Therefore, even if voltage V1 returns to a level lower than that before stop idling when the engine completes restart, DC/DC converter 24 stops when sample timing signal 27 turns off. This is because output from AND circuit 101 turns off when at least one of output from hysteresis comparator 100 to be input to AND circuit 101 and sample timing signal 27.

The operation of such power supply unit 20 is shown in FIG. 19. Here, the operation from time t0 to t5 is the same as that of FIG. 15, and thus its description is omitted.

The assumption is made that voltage V1 of power source 22 does not recover to the original value and voltage Va corresponding to voltage V1 does not reach threshold voltage Vc as shown in FIG. 19 even if at time t5 the engine completes restart after stop idling. Consequently, output from hysteresis comparator 100 remains on. At this moment, sample timing signal 27 is on as shown in FIG. 19, and thus output from AND circuit 101 turns on. Consequently, as shown in FIG. 19, DC/DC converter start-up signal remains on at time t5 and DC/DC converter 24 continues its operation. Meanwhile, as shown in FIG. 19, selection switch 23 remains off.

After that, the assumption is made that sample timing signal 27 turns off at time t6 as shown in FIG. 19. This makes output from AND circuit 101 turns off, and thus as shown in FIG. 19, DC/DC converter start-up signal 29 turns off and DC/DC converter 24 turns off while selection switch 23 turns on as shown in FIG. 19. Consequently, voltage V1 of power source 22 becomes equal to voltage V2 at load 21. However, since voltage V1 has not recovered to the voltage before stop idling, voltage V2 drops at time t6 to a voltage lower than the voltage before stop idling as shown in FIG. 19, and then becomes stabilized while retaining the low voltage. Accordingly, voltage Vb corresponding to voltage V2 also drops to a low voltage at time t6 and then becomes stabilized as shown in FIG. 19.

With such operation, DC/DC converter 24 does not continue its operation even if voltage V1 returns to a voltage lower than the voltage before stop idling when the engine completes restart, thereby reducing power consumption of DC/DC converter 24.

In the structure of FIG. 18, like in the structure of FIG. 16, the resistances of resistors 78, 80 for detecting voltage V2 may be set to k times those of resistors 90, 92 for detecting voltage V1, as the same as explained previously with respect to V2 in FIG. 12, and hold voltage Vh may be input to the non-inverting input of operational amplifier 94.

The above-described structure and operation implement power supply unit 20 in which the difference is always small between the voltage of power source 22 in normal times and the output voltage of DC/DC converter 24 when temporarily fluctuating due to voltage drop of power source 22.

Seventh Exemplary Embodiment

Figure 20:
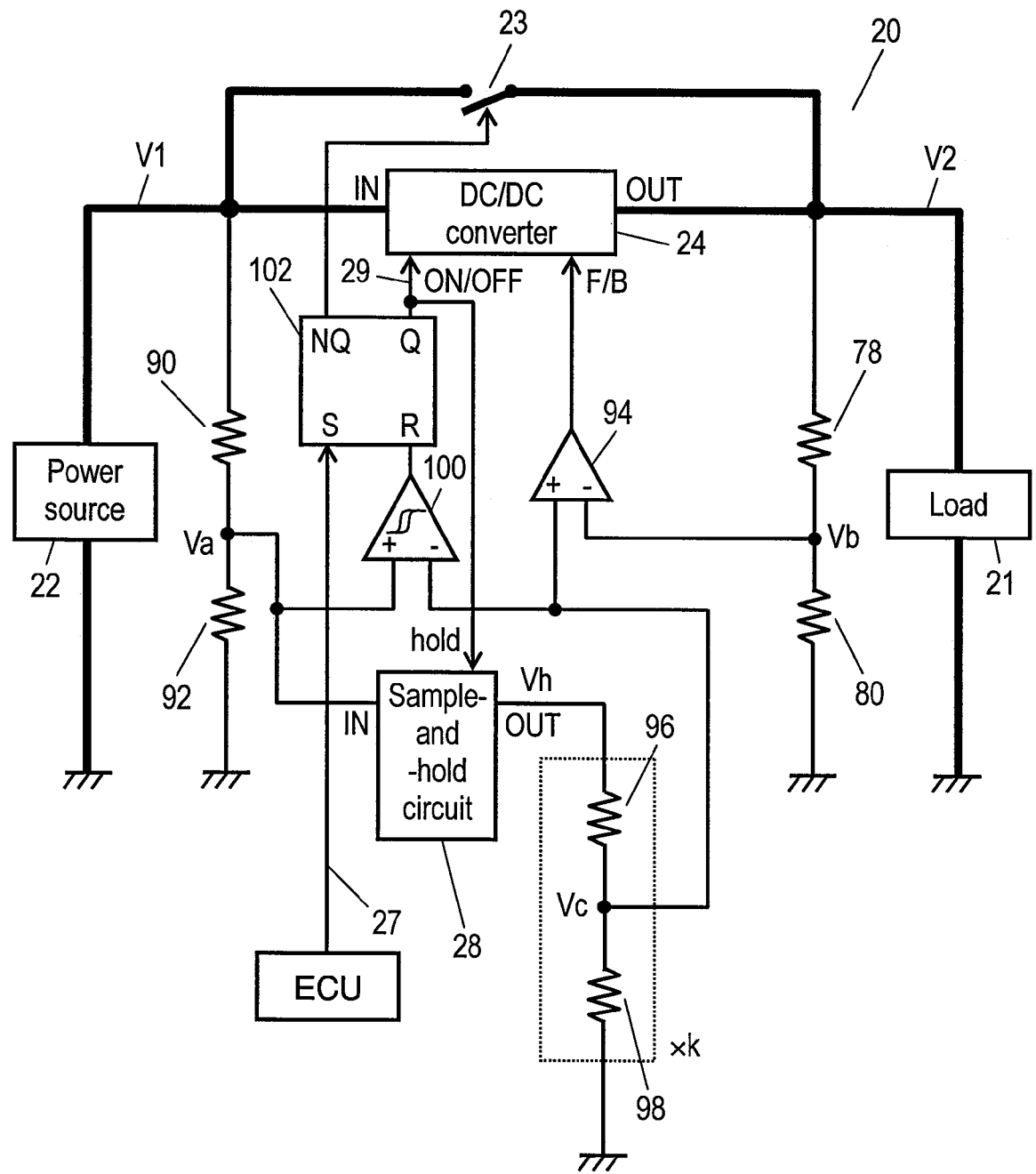
FIG. 20 is a block circuit diagram of a power supply unit according to the seventh embodiment of the present invention.
Figure 21:
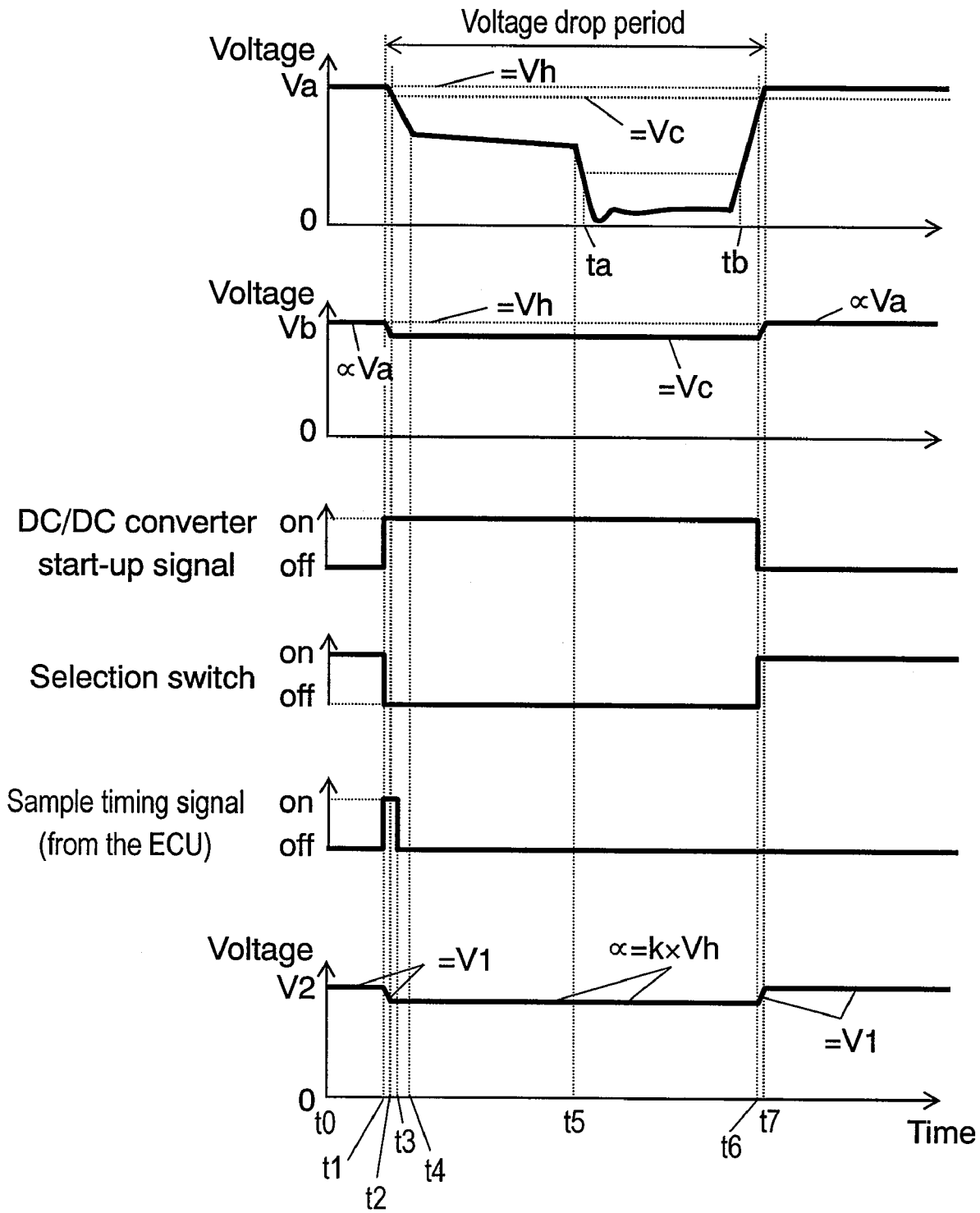
FIG. 21 is a timing diagram showing the operation of the power supply unit according to the seventh embodiment of the present invention.
Figure 22:
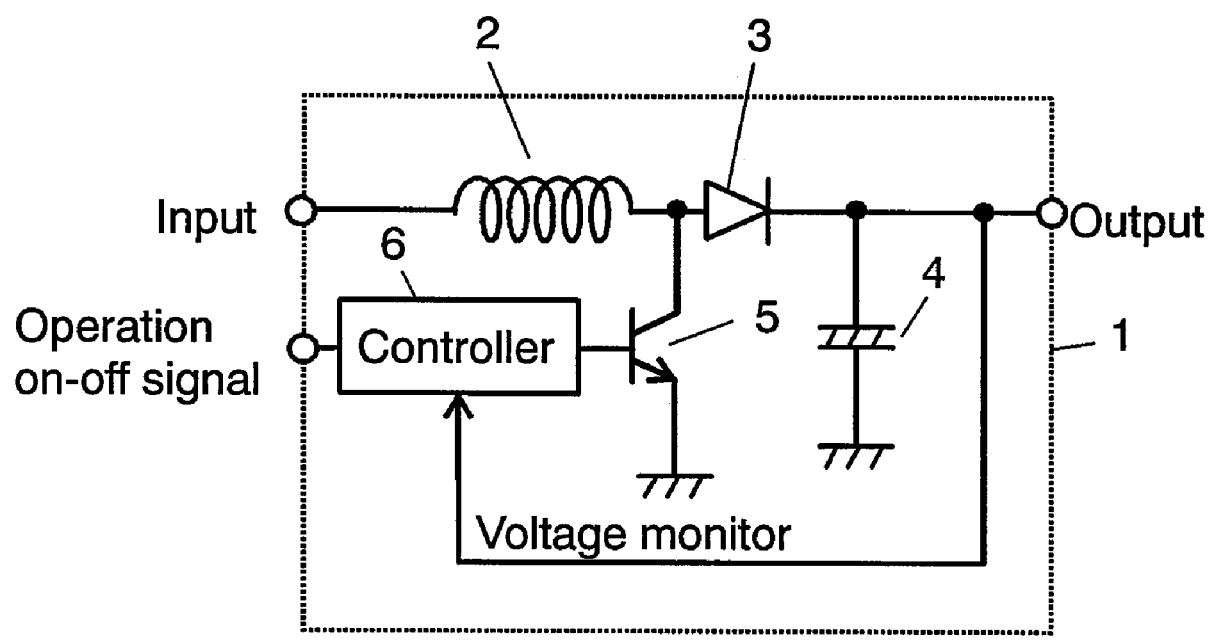
FIG. 22 is a block circuit diagram of the voltage drop protection circuit of a conventional power supply unit.

FIG. 20 is a block circuit diagram of a power supply unit according to the seventh embodiment of the present invention. FIG. 21 is a timing diagram showing the operation of the power supply unit according to the seventh embodiment of the present invention. FIG. 21 includes time-lapse change of voltage Va when voltage V1 of the power source is resistively divided with a resistance for detecting voltage V1, time-lapse change of voltage Vb when voltage V2 supplied to a load is resistively divided with resistors 78, 80 for detecting voltage V2, an on-off timing diagram of DC/DC converter start-up signal 29, an on-off timing diagram of a selection switch, an on-off timing diagram of sample timing signal 27, and time-lapse change of voltage V2 supplied to the load.

In FIG. 20, a component same as that in FIG. 14 is given the same reference mark to omit its detailed description. Heavy lines indicate wiring of the power system, and thin lines, the control system. In FIG. 21, description for the operation shown by heavy dotted lines in FIG. 5 and others is omitted in the same way as in FIG. 11. In the seventh embodiment also, in the same way as in the second embodiment, a description is made, in a vehicle with stop idling function, for example, for the structure in which, when voltage of a power source (composed of a battery and a power generator) drops, the voltage is stepped up and its DC output is supplied to a load.

Compared with the structure of FIG. 14, the structural features of FIG. 20 are (1) through (4) below.

(1) Reset-set flip-flop circuit 102 is provided, sample timing signal 27 is input to set terminal S, output from hysteresis comparator 100 is connected to reset terminal R, output terminal Q is connected to on-off terminal ON/OFF of DC/DC converter 24, and output from inverted output terminal NQ of output terminal Q is made to be an on-off signal for the selection switch. Accordingly, DC/DC converter start-up signal 29 is an output signal of output terminal Q.

(2) Following the above, inverting circuit 74 is eliminated.

(3) Hold terminal "hold" of sample-and-hold circuit 28 is connected to output terminal Q of reset-set flip-flop circuit 102.

(4) The non-inverting input and inverting input of hysteresis comparator 100 are reversed.

The logical table of input (S,R) of reset-set flip-flop circuit 102 to output (Q,NQ) is shown in table 1.

TABLE 1

| S | R | Q | NQ |
|---|---|---|---|
| 0 | 0 | Retains the previous value | Retains the previous value |
| 0 | 1 | 0 | 1 |
| 1 | 0 | 1 | 0 |
| 1 | 1 | 1 | 0 |

In the seventh embodiment, reset-set flip-flop circuit 102 prioritizes input of set terminal S, and thus as shown in Table 1, when input of set terminal S is 1, namely when sample timing signal 27 is on, reset-set flip-flop circuit 102 always outputs Q=1 and NQ=0. Accordingly, when Q=1, the start-up signal for DC/DC converter 24 turns on to start up DC/DC converter 24. Simultaneously, hold terminal "hold" of sample-and-hold circuit 28 turns on to maintain hold voltage Vh. Since NQ=0, which corresponds to turning off selection switch 23, selection switch 23 is turned off.

Next, the operation of such power supply unit 20 is described. The biggest difference in operation between the seventh embodiment and the fifth or sixth embodiment is that sample timing signal 27 delivered from the ECU is a pulse signal delivered only when stop idling is started. Therefore, completion of an engine restart cannot be detected from sample timing signal 27. Hereinafter, a description is made for details about the operation mainly on control for such a difference.

First, in FIG. 21, the engine is being driven at time t0. At this moment, sample timing signal 27 is off, which corresponds to the state in which 0 is being input to set terminal S of reset-set flip-flop circuit 102. Meanwhile, reset terminal R behaves as the following.

At time t0, since the engine is being driven to operate the generator, voltage V1 is approximately 14 V (i.e. maximum value) and voltage Va corresponding to voltage V1 is at its maximum value. Here, if hold terminal "hold" of sample-and-hold circuit 28 is off, hold voltage Vh=Va. Meanwhile, threshold voltage Vc=0.9×Vh, thus Va>Vc, where output from hysteresis comparator 100 is on (=1). This is because the non-inverting input and inverting input of hysteresis comparator 100 of the sixth embodiment are connected being reversed.

If hold terminal "hold" is on, meanwhile, sample-and-hold circuit 28 continues to output some hold voltage Vh. At this moment, as described above, the maximum hold voltage Vh possible to output is equal to the maximum voltage Va. Now, since the engine is being driven, voltage Va is at its maximum value. Accordingly, hold voltage Vh does not exceed voltage Va. Therefore, always Va>Vc in the same way as when hold terminal "hold" is off, and output from hysteresis comparator 100 is on (=1).

From all of the above, output from hysteresis comparator 100 is on (=1) at time t0 whether hold terminal "hold" is on or off, and thus 1 is input to reset terminal R of reset-set flip-flop circuit 102. Consequently, 0 is to be input to set terminal S, and 1 to reset terminal R, thus Q=0 and NQ=1 are output according to table 1.

From all of the above, at time t0, DC/DC converter start-up signal 29 turns off according to FIG. 21 because Q=0, and selection switch 23 turns on because NQ=1. Meanwhile, hold terminal "hold" of sample-and-hold circuit 28 is off, namely in a state not holding, because Q=0.

Next, a stop idling state is assumed to be entered at time t1. At this moment, as shown in FIG. 21, sample timing signal 27 from the ECU turns on to input 1 to set terminal S of reset-set flip-flop circuit 102. Consequently, as shown in table 1, when set terminal S is 1, Q=1 and NQ=0 regardless of the value of reset terminal R. Accordingly, as shown in FIG. 21, DC/DC converter start-up signal 29 turns on at time t1 to start up DC/DC converter 24 while selection switch 23 turns off as shown in FIG. 21. This makes hold terminal "hold" of sample-and-hold circuit 28 to turn on to hold voltage Va at time t1. Hold voltage Vh at this moment is multiplied by k (0.9) with resistors 96, 98 for multiplying voltage Vh by a constant, and threshold voltage Vc obtained is input to operational amplifier 94. This makes DC/DC converter 24 to operate so that voltage Vb becomes threshold voltage Vc. Here, the reason why Vh>Vc is as described in the sixth embodiment. Accordingly, voltage V2 output from DC/DC converter

24 is a predetermined constant times (k times) lower than voltage V1 of power source 22 when held.

Meanwhile, threshold voltage Vc is also input to hysteresis comparator 100, where Va>Vc at time t1 as is clear from FIG. 21. Accordingly, output from hysteresis comparator 100 becomes an on signal to input 1 to reset terminal R of reset-set flip-flop circuit 102. At this moment, however, 1 is being input to set terminal S, and thus output from DC/DC converter 24 is supplied to load 21. Control is performed so that voltage V2 output from DC/DC converter 24 becomes voltage corresponding to threshold voltage Vc, where Va>Vc from time t1 to t2 as shown by the time-lapse change of Va in FIG. 21. Therefore, as described in the fifth embodiment, DC/DC converter 24 operates so as to almost directly output voltage at input terminal IN from output terminal OUT. Consequently, as shown in FIG. 21, voltage V2 decreases according to voltage V1 decreasing, and so does voltage Vb corresponding to voltage V2 as shown in FIG. 21.

After that, Va becomes to be Va<Vc at time t2 as shown by the time-lapse change of Va in FIG. 21. Consequently, output from hysteresis comparator 100 becomes an off signal to input 0 to reset terminal R of reset-set flip-flop circuit 102. At this moment, however, 1 continues to be input to set terminal S, and thus as shown by the time-lapse change of V2 in FIG. 21, voltage V2 corresponding to threshold voltage Vc (=k× Vh) is applied from DC/DC converter 24 to load 21.

Next, pulse sample timing signal 27 is assumed to turn off at time t3. Then, 0 is input to set terminal S of reset-set flip-flop circuit 102. At this moment, 0 continues to be input to reset terminal R because Va<Vc as described above. This corresponds to the case where both set terminal S and reset terminal R are 0 in Table 1, and thus Q and NQ are output so as to hold their previous values. Since the previous values are S=1 and R=0, Q and NQ become Q=1 and NQ=0. Accordingly, after time t3, DC/DC converter 24 maintains an on state because Q=1 as shown in FIG. 21 while hold voltage Vh is maintained because hold terminal "hold" of sample-and-hold circuit 28 is on. Accordingly, threshold voltage Vc also becomes constant. Since NQ=0 as shown in FIG. 21, selection switch 23 remains off. Therefore, as shown in FIG. 21, voltage V2 corresponding to threshold voltage Vc (=k×Vh) remains being applied to load 21.

To summarize the above-described operation, when sample timing signal 27 turns on at a time point before voltage V1 of power source 22 drops (here, time t1 when voltage V1 start to drop), voltage Va corresponding to voltage V1 of power source 22 is held by sample-and-hold circuit 28 while DC/DC converter 24 is to be started up and selection switch 23 is to be turned off. Here, as described in the fifth embodiment, sample timing signal 27 may be turned on at any time before voltage V1 drops, the time being desirably immediately before voltage V1 drops as possible.

Next, the operations at time t4 and t5 are the same as those at time t2 and t3 in FIG. 11 in the fifth embodiment, respectively, and thus their description is omitted.

When time t6 is reached, the engine restart nearly completes; voltage V1 of power source 22 rises; and voltage Va corresponding to voltage V1 increases to exceed threshold voltage Vc. Consequently, output from hysteresis comparator 100 turns on (=1). Accordingly, 1 is input to reset terminal R of reset-set flip-flop circuit 102. Meanwhile, as shown in FIG. 21, as sample timing signal 27 remains off, 0 remains being input to set terminal S. Therefore, Q and NQ become Q=0 and NQ=1 according to Table 1. Accordingly, as shown in FIG. 21, DC/DC converter start-up signal 29 turns off because Q=0 at time t6 to turn off DC/DC converter 24 while hold terminal "hold" of sample-and-hold circuit 28 turns off to make hold voltage Vh equal to voltage Va. Accordingly, Va is always Va>Vc after time t6, and output from hysteresis comparator 100 remains on (=1). Meanwhile, because NQ=1 as shown in FIG. 21, selection switch 23 turns on. Accordingly, voltage V1 of power source 22 is supplied to load 21. Consequently, until time t7 when the engine start completes, voltage Vb continues to increase according to voltage Va increasing and be stabilizes at time t7.

After time t7, 0 continues to be input to set terminal S of reset-set flip-flop circuit 102, and 1 to reset terminal R, respectively, and thus progress is made while retaining Q=0 and NQ=1.

To summarize such operation at an engine restart, when voltage Va corresponding to voltage V1 of power source 22 recovers to a level higher than positive threshold voltage Vc that is a predetermined constant times (in the seventh embodiment, predetermined constant k=0.9) lower than hold voltage Vh, DC/DC converter 24 stops while selection switch 23 is to be turned on. With this operation, the state after time t7 results in having returned to that at time t0.

With the above-described operation, during the voltage drop period (from time t1 to t7) shown in FIG. 21, from time t1 to t6, DC/DC converter 24 operates so as to continue supplying load 21 with voltage corresponding to threshold voltage Vc, and from time t6 to t7, voltage value corresponding to that between hold voltage Vh and threshold voltage Vc is supplied. Consequently, load 21 is stably driven even if voltage of power source 22 largely fluctuates.

With the operation of the seventh embodiment, even if pulse sample timing signal 27 is input and a completion signal of an engine restart is not obtained, DC/DC converter 24 can be operated only when needed in the same way as in the sixth embodiment.

In the structure of FIG. 20, as well as in that of FIG. 16 described in the sixth embodiment, the resistances of resistors 78, 80 for detecting voltage V2 may be set to k times those of resistors 90, 92 for detecting voltage V1, and hold voltage Vh may be input to the non-inverting input of operational amplifier 94. In the operation in this case, final output voltage V2 is the same as the time-lapse change characteristic of V2 in FIG. 21, where the time-lapse change characteristic of Vb in FIG. 21 is merely replaced by the time-lapse change in FIG. 17, and thus whichever structure may be employed.

The above-described structure and operation implement power supply unit 20 in which the difference is always small between the voltage of power source 22 in normal times and the output voltage of DC/DC converter 24 when temporarily fluctuating due to a voltage drop at power source 22.

In the embodiments fifth through seventh, the description is made for the case where predetermined constant k is set to 0.9, but an arbitrary number can be set. Particularly, when predetermined constant k is set low (e.g. as shown by ta and tb in the time-lapse change of Va in FIG. 21), DC/DC converter 24 can be made to perform step-up operation only during the period from time ta to tb during which voltage Va corresponding to voltage V1 is too low to drive load 21 although DC/DC converter 24 has been started up. That is, from time t1 to ta and time tb to t6, input voltage of DC/DC converter 24 is higher than output voltage, and thus DC/DC converter 24 almost directly outputs voltage at input terminal IN from output terminal OUT as described above and does not perform step-up operation. This operation further reduces step-up operating time of DC/DC converter 24.

INDUSTRIAL APPLICABILITY

A power supply unit according to the present invention supplies a load with voltage corresponding to the voltage of a power source in normal times of the power source even when voltage of the power source temporarily fluctuates, thereby continuing to stably operate the load. Therefore, the power supply unit is useful because it compensates a voltage drop at the power source such as a battery producing voltage fluctuation over a long duration according to an environment change.

The invention claimed is:

1. A power supply unit comprising:
    a power source;
    a DC/DC converter connected to the power source; and
    a sample-and-hold circuit sampling and holding a voltage corresponding to a voltage supplied from the power source to load according to a sample timing signal,
    wherein a voltage output from the DC/DC converter is changed according to a voltage fluctuation of the power source, and an output set value of the DC/DC converter is controlled by voltage held.

2. The power supply unit of claim 1, further comprising a selection switch for supplying power to a load, the selection switch switching between an output from the power source and an output from the DC/DC converter.

3. The power supply unit of claim 1,
    wherein the DC/DC converter obtains an output voltage from one of the power source and an auxiliary power supply,
    wherein an output set value of a voltage of the auxiliary power supply is controlled by the voltage held by the sample-and-hold circuit, and
    wherein power is supplied from the auxiliary power supply to the load when a voltage of the power source drops.

4. The power supply unit of claim 3, wherein an output from the DC/DC converter is set so that voltage supplied from the auxiliary power supply to the load is lower than the voltage supplied from the power source to the load.

5. The power supply unit of claim 3, further comprising a rectifier element connected between an output from the DC/DC converter and the load, wherein the output set value of the DC/DC converter is preliminarily raised by a voltage corresponding to a voltage drop of the rectifier element.

6. The power supply unit of claim 3, wherein the DC/DC converter converts voltage by alternately turning on and off two switches, and power is supplied from the power source to the load through the DC/DC converter by turning on one of the switches connected between an input and the output of the DC/DC converter in normal times when the voltage of the power source is not dropped.

7. The power supply unit of claim 3, wherein the DC/DC converter is operated only while the auxiliary power supply is charged or discharged.

8. The power supply unit of claim 1, wherein the DC/DC converter obtains the output voltage from one of the power source and an auxiliary power supply, and a temporary fluctuation portion of a current from the power source is absorbed or discharged by the auxiliary power supply through the DC/DC converter.

9. The power supply unit of claim 1, wherein
    when the sample timing signal turns on before a time point when the voltage of the power source drops, a voltage corresponding to the voltage of the power source is held by the sample-and-hold circuit, and the DC/DC converter is started, and
    when the sample timing signal turns off after a time point when the voltage corresponding to the voltage of the power source recovers to the voltage held, the DC/DC converter is stopped.

10. The power supply unit of claim 9, wherein the output voltage from the DC/DC converter is set so as to be a voltage constant times lower than the voltage of the power source when held.

11. The power supply unit of claim 1,
    wherein, when the sample timing signal turns on before a time point when the voltage of the power source drops, a voltage corresponding to the voltage of the power source is held by the sample-and-hold circuit, and when voltage corresponding to the voltage of power source drops to a positive threshold voltage that is a predetermined constant times lower voltage than the voltage held, the DC/DC converter is started,
    wherein the output voltage from the DC/DC converter is set so as to be the predetermined constant times lower voltage than the voltage of the power source when held, and
    wherein, when the voltage corresponding to the voltage of the power source recovers to a voltage higher than the threshold voltage, or when the sample timing signal turns off, the DC/DC converter is stopped.

12. The power supply unit of claim 1,
    wherein, when the sample timing signal turns on before a time point when the voltage of the power source drops, a voltage corresponding to the voltage of the power source is held by the sample-and-hold circuit and the DC/DC converter is started,
    wherein the output voltage from the DC/DC converter is set so as to be a predetermined constant times lower voltage than the voltage of the power source when held, and
    wherein, when the voltage corresponding to the voltage of the power source recovers to a voltage higher than a positive threshold voltage that is the predetermined constant times lower voltage than the voltage held, the DC/DC converter is stopped.

* * * * *